(12) United States Patent
Matsumura et al.

(10) Patent No.: US 9,705,043 B2
(45) Date of Patent: Jul. 11, 2017

(54) LIGHT-EMITTING DIODE, LIGHT-EMITTING DIODE LAMP, AND ILLUMINATION DEVICE

(71) Applicant: SHOWA DENKO K.K., Tokyo (JP)

(72) Inventors: Atsushi Matsumura, Chichibu (JP); Yu Tokunaga, Chichibu (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 14/434,801

(22) PCT Filed: Oct. 8, 2013

(86) PCT No.: PCT/JP2013/077334
§ 371 (c)(1),
(2) Date: Apr. 10, 2015

(87) PCT Pub. No.: WO2014/061503
PCT Pub. Date: Apr. 24, 2014

(65) Prior Publication Data
US 2015/0255680 A1 Sep. 10, 2015

(30) Foreign Application Priority Data

Oct. 16, 2012 (JP) .................................. 2012-229183

(51) Int. Cl.
*H01L 33/40* (2010.01)
*H01L 33/38* (2010.01)
(Continued)

(52) U.S. Cl.
CPC ............ *H01L 33/387* (2013.01); *H01L 33/10* (2013.01); *H01L 33/30* (2013.01); *H01L 33/44* (2013.01);
(Continued)

(58) Field of Classification Search
CPC ... H01L 27/32–27/326; H01L 51/50–51/5012; H01L 51/525–51/5287;
(Continued)

(56) References Cited

U.S. PATENT DOCUMENTS

2007/0096130 A1 5/2007 Schiaffino et al.
2010/0065867 A1\* 3/2010 Unno .............................. 257/98
(Continued)

FOREIGN PATENT DOCUMENTS

CN 101820042 A 9/2010
JP 06-302857 A 10/1994
(Continued)

OTHER PUBLICATIONS

English Translation of WO 2012/137769 A1, by Matsumura et al., Oct. 2012.\*

(Continued)

*Primary Examiner* — Earl Taylor
*Assistant Examiner* — Samuel Park
(74) *Attorney, Agent, or Firm* — Sughrue Mion, PLLC

(57) ABSTRACT

In a light-emitting diode, a plurality of dot-shaped ohmic contact electrodes are provided between a metal reflective film and a compound semiconductor layer, an ohmic electrode and a surface electrode composed of a pad portion and a plurality of linear portions connected to the pad portion are provided in that order on the opposite side of the compound semiconductor layer from the semiconductor substrate, the surface of the ohmic electrode is covered with the linear portions, the ohmic contact electrodes and the ohmic electrode are formed in positions that do not overlap with the pad portion in plan view, and among the plurality of ohmic contact electrodes, 5% or more and 40% or less of the ohmic contact electrodes are disposed in positions that overlap with the linear portions in plan view.

14 Claims, 13 Drawing Sheets

(51) Int. Cl.
*H01L 33/30* (2010.01)
*H01L 33/44* (2010.01)
*H01L 33/10* (2010.01)
*H01L 33/00* (2010.01)

(52) U.S. Cl.
CPC ........ *H01L 33/0079* (2013.01); *H01L 33/405* (2013.01)

(58) Field of Classification Search
CPC .............. H01L 2227/32–2227/326; H01L 2251/5323–2251/5361; H01L 2924/12044; H01L 33/38; H01L 33/48; H01L 33/22; H01L 33/405
USPC ............... 257/E33.001, 79–103, 40, 59, 72, 257/E51.001, E51.01
See application file for complete search history.

(56) References Cited

U.S. PATENT DOCUMENTS

| | | |
|---|---|---|
| 2011/0068359 A1 | 3/2011 | Yahata et al. |
| 2012/0007116 A1 | 1/2012 | Nakano et al. |
| 2014/0001508 A1* | 1/2014 | Tasaki et al. .................. 257/98 |

FOREIGN PATENT DOCUMENTS

| | | |
|---|---|---|
| JP | 2588849 B | 3/1997 |
| JP | 2001-057441 A | 2/2001 |
| JP | 2001-339100 A | 12/2001 |
| JP | 2002-246640 A | 8/2002 |
| JP | 2006-032952 A | 2/2006 |
| JP | 2007-081010 A | 3/2007 |
| JP | 2010-067891 A | 3/2010 |
| JP | 2010-186802 A | 8/2010 |
| JP | 2012-084779 A | 4/2012 |
| JP | 2012-129357 A | 7/2012 |
| WO | 2012/137769 A1 | 10/2012 |
| WO | WO 2012137769 A1 * | 10/2012 |

OTHER PUBLICATIONS

Communication dated May 11, 2015, issued by the Taiwanese Patent Office in counterpart Application No. 102136443.
International Search Report for PCT/JP2013/077334 dated Nov. 5, 2013.
Communication dated Sep. 1, 2016 from the State Intellectual Property Office of the P.R.C. in counterpart Application No. 201380052677.3.

* cited by examiner

US 9,705,043 B2

LIGHT-EMITTING DIODE, LIGHT-EMITTING DIODE LAMP, AND ILLUMINATION DEVICE

CROSS REFERENCE TO RELATED APPLICATIONS

This application is a National Stage of International Application No. PCT/JP2013/077334 filed Oct. 8, 2013, claiming priority based on Japanese Patent Application No. 2012-229183, filed Oct. 16, 2012, the contents of all of which are incorporated herein by reference in their entirety.

BACKGROUND OF THE INVENTION

Field of the Invention

The present invention relates to a light-emitting diode, a light-emitting diode lamp and an illumination device, and relates particularly to a light-emitting diode, a light-emitting diode lamp and an illumination device which are suited to high-brightness light emission.

Description of Related Art

Examples of known high-brightness light-emitting diodes (English abbreviation: LED) which emit red or infrared light include compound semiconductor light-emitting diodes having a light-emitting layer formed from aluminum gallium arsenide (composition formula: $Al_XGa_{1-X}As$, $0 \leq X \leq 1$) or a light-emitting layer formed from indium gallium arsenide (composition formula: $In_XGa_{1-X}As$, $0 \leq X \leq 1$). On the Other Hand, examples of known high-brightness light-emitting diodes which emit red, orange, yellow or yellow-green visible light include compound semiconductor light-emitting diodes having a light-emitting layer formed from aluminum gallium indium phosphide (composition formula $Al_X Ga_{1-X})_Y In_{1-Y}P$, $0 \leq X \leq 1$ and $0 \leq Y \leq 1$). The substrates for these compound semiconductor light-emitting diodes have generally used substrate materials such as gallium arsenide (GaAs), which are optically opaque relative to the light emitted from the light-emitting layer and do not exhibit particularly high mechanical strength.

As a result, techniques for constructing junction-type LEDs have recently been disclosed with the aim of obtaining LEDs of even higher brightness, or achieving improved mechanical strength and heat dissipation properties for these devices. These techniques involve removing the substrate material that is opaque relative to the emitted light, and joining a new support substrate composed of a material that either transmits or reflects the emitted light and exhibits excellent mechanical strength and heat dissipation properties, thereby forming a junction-type LED (for example, see Patent Documents 1 to 7).

PRIOR ART DOCUMENTS

Patent Documents

[Patent Document 1] Japanese Unexamined Patent Application, First Publication No. 2001-339100
[Patent Document 2] Japanese Unexamined Patent Application, First Publication No. Hei 06-302857
[Patent Document 3] Japanese Unexamined Patent Application, First Publication No. 2002-246640
[Patent Document 4] Japanese Patent (Granted) Publication No. 2,588,849
[Patent Document 5] Japanese Unexamined Patent Application, First Publication No. 2001-57441
[Patent Document 6] Japanese Unexamined Patent Application, First Publication No. 2007-81010
[Patent Document 7] Japanese Unexamined Patent Application, First Publication No. 2006-32952

SUMMARY OF THE INVENTION

In high-brightness light-emitting diodes, in order to enable the supply of a large current to the surface electrode, the surface electrode preferably has an adequately large bonding pad. However, a problem arises in that the bonding pad absorbs the light emitted by the light-emitting unit, causing a deterioration in the light extraction efficiency. This problem of light absorption at the surface electrode pad portion is particularly marked in high-brightness light-emitting diodes.

The present invention has been developed in light of the above circumstances, and has an object of providing a light-emitting diode, a light-emitting diode lamp and an illumination device in which light absorption at the surface electrode is reduced, and a low forward voltage is achieved, while maintaining a high light emission output, by improving the positional relationship of the ohmic electrodes that sandwich the compound semiconductor layer.

In order to achieve the above object, from the viewpoint of eliminating factors causing the absorption of the emitted light, a configuration was adopted in which the growth substrate was removed and replaced with a support substrate exhibiting less light absorption. Further, in this regard, in order to reduce the light absorption at the pad (bonding pad) portion of the surface electrode, a configuration was adopted in which no light emission was generated directly beneath the surface electrode pad portion. Furthermore, the inventors discovered that in a configuration in which, among the plurality of ohmic contact electrodes dispersed across the semiconductor substrate side of the compound semiconductor layer containing the light-emitting layer, a prescribed proportion of the ohmic contact electrodes are arranged in positions which, when viewed in plan view, overlap with linear portions of the surface electrode that are connected to the pad portion, a low forward voltage could be achieved while maintaining a high light emission output, and they were therefore able to complete the present invention. Conventionally, it had been thought that employing a configuration in which the plurality of ohmic contact electrodes dispersed across the semiconductor substrate side of the compound semiconductor layer containing the light-emitting layer were arranged in positions which, when viewed in plan view, did not overlap with the linear portions of the surface electrode that were connected to the pad portion enabled the current to disperse across the entire device, and was therefore preferable.

In other words, in order to achieve the above object, the present invention employs the aspects described below.

(1) A light-emitting diode according to one aspect of the present invention includes a junction layer, a reflective structure containing a metal reflective film, and a compound semiconductor layer, which contains a first cladding layer, a second cladding layer, and a light-emitting layer sandwiched between the first cladding layer and the second cladding layer, provided in that order on a semiconductor substrate, wherein a plurality of dot-shaped ohmic contact electrodes are provided between the metal reflective film and the compound semiconductor layer, an ohmic electrode and a surface electrode composed of a pad portion and a plurality of linear portions connected to the pad portion are provided in that order on the opposite side of the compound semiconductor layer from the semiconductor substrate, the surface of the ohmic electrode is covered with the linear portions, the ohmic contact electrodes and the ohmic electrode are formed in positions that do not overlap with the pad portion in plan view, and among the plurality of ohmic contact electrodes, 5% or more and 40% or less of the ohmic contact electrodes are disposed in positions that overlap with the linear portions in plan view.

(2) In the light-emitting diode disclosed above in (1), the pad portion may be circular when viewed in plan view.

(3) In the light-emitting diode disclosed above in (1) or (2), the linear portions may be composed of two first linear portions, which extend in a linear direction from peripheral edges on either side of the diameter of the pad portion, along a line that passes through the center of the pad portion, and a plurality of second linear portions which each extends in a direction orthogonal to the first linear portions.

(4) In the light-emitting diode disclosed above in (1) or (2), the linear portions may be composed of two second linear portions which extend along lines that are tangent to peripheral edges of the circular pad portion.

(5) In the light-emitting diode disclosed above in any one of (1) to (4), the reflective structure may be composed of a transparent dielectric film and a metal film.

(6) In the light-emitting diode disclosed above in (5), the thickness of the transparent dielectric film may be ¾ or ⁵⁄₄ of the wavelength emitted by the light-emitting diode in the transparent dielectric film.

(7) In the light-emitting diode disclosed above in (5) or (6), the transparent dielectric film may be composed of $SiO_2$.

(8) In the light-emitting diode disclosed above in any one of (1) to (7), the pad portion may be composed of a plurality of circular pads.

(9) In the light-emitting diode disclosed above in any one of (1) to (8), the semiconductor substrate may be composed of any of Ge, Si, GaP and GaAs.

(10) In the light-emitting diode disclosed above in any one of (1) to (9), the junction layer may include a combination of any of an Au layer, an AuGe layer, an AuSn layer, an AuSi layer and an AuIn layer.

(11) In the light-emitting diode disclosed above in any one of (1) to (10), the light-emitting layer may be composed of any of AlGaAs, InGaAs, GaInP, and AlGaInP.

(12) A light-emitting diode lamp according to another aspect of the present invention contains the light-emitting diode disclosed above in any one of (1) to (11).

(13) An illumination device according to another aspect of the present invention is equipped with a plurality of the light-emitting diodes disclosed above in any one of (1) to (11).

According to the light-emitting diode of the present invention, light absorption at the surface electrode is reduced, and a low forward voltage can be achieved while maintaining a high light emission output.

DETAILED DESCRIPTION OF THE INVENTION

Figure 1:
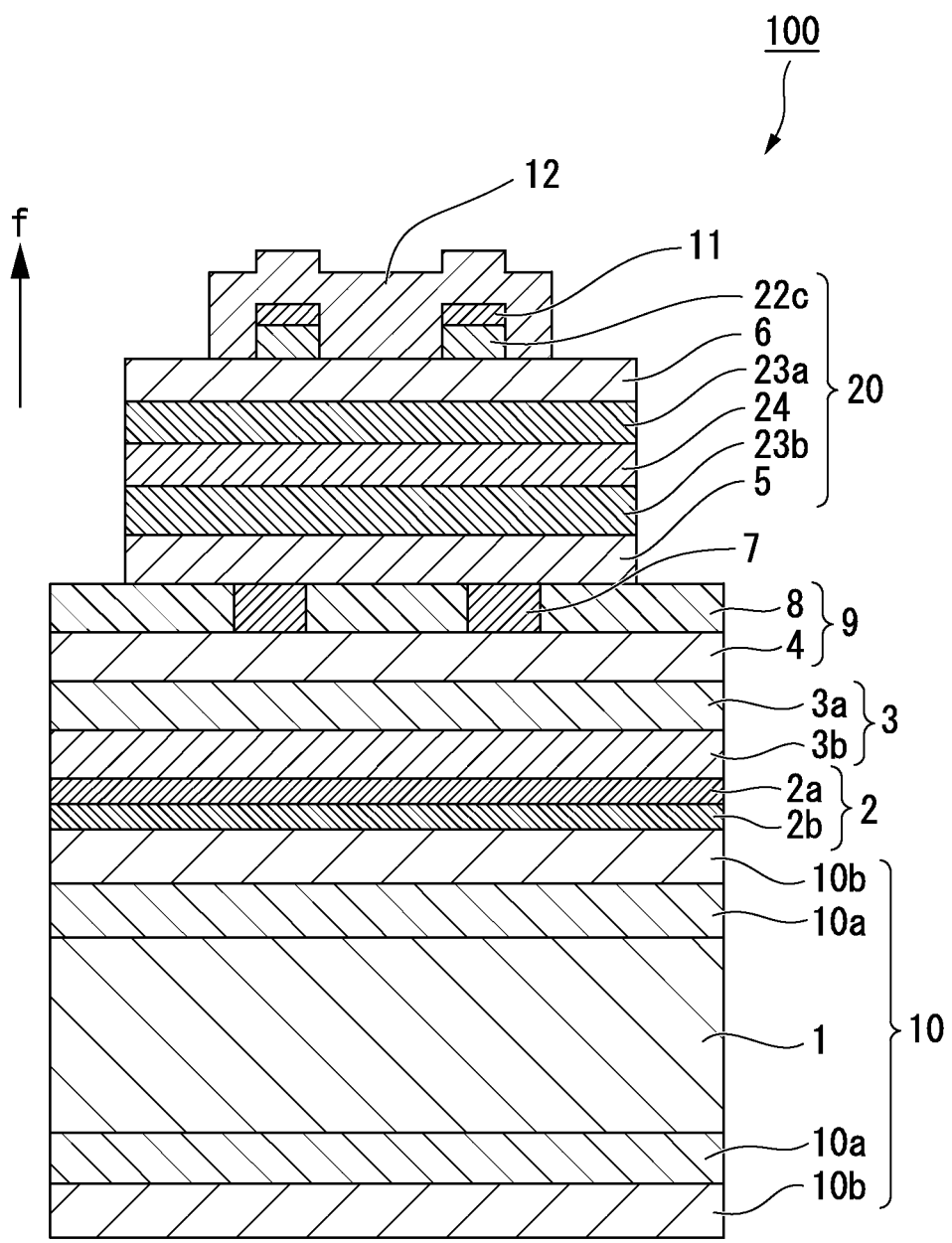
FIG. 1 is a schematic cross-sectional view of a light-emitting diode of a first embodiment of the present invention.

The configurations of a light-emitting diode, a light-emitting diode lamp and an illumination device according to embodiments applying the present invention are described below by using the drawings. The drawings used in the following description have in some cases been drawn with certain features enlarged in order to assist with comprehension of those features, and as a result, the dimensional ratios between each of the structural elements in the drawings may not necessarily be the same as the actual ratios. Further, the materials and dimensions and the like presented in the following description are merely examples, and in no way limit the present invention, meaning various modifications can be made without departing from the scope of the present invention.

[Light-Emitting Diode (First Embodiment)]

FIG. 1 is a schematic cross-sectional view illustrating one example of a light-emitting diode of an embodiment applicable to the present invention.

The light-emitting diode 100 of this embodiment includes a junction layer 2, a reflective structure 9 containing a metal reflective film 4, and a compound semiconductor layer 20 containing a light-emitting layer sandwiched between a first cladding layer and a second cladding layer, provided in that order on a semiconductor substrate 1, wherein a plurality of dot-shaped ohmic contact electrodes 7 are provided between the metal reflective film 4 and the compound semiconductor layer 20, an ohmic electrode 11 and a surface electrode 12 composed of a pad portion 12a (see FIG. 2A to 2D) and a plurality of linear portions 12b (see FIG. 2A to 2D) connected to the pad portion are provided in that order on the opposite side of the compound semiconductor layer from the semiconductor substrate, the surface of the ohmic electrode 11 is covered with the linear portions 12b, the ohmic contact electrodes 7 and the ohmic electrode 11 are formed in positions that do not overlap with the pad portion 12a when viewed in plan view, and among the plurality of ohmic contact electrodes 7, at least 5% or more and 40% or less of the ohmic contact electrodes are disposed in positions that overlap with the linear portions in plan view.

In the example illustrated in FIG. 1, the ohmic contact electrodes 7 are composed of a plurality of dot-shaped conductive members, and a transparent dielectric film 8 is used to fill the spaces between the conductive members. Further, a lower current diffusion layer 5 is provided on the compound semiconductor layer 20 on the side of the transparent dielectric film 8, and an upper current diffusion layer 6 is provided on the side of the surface electrode. Furthermore, a diffusion prevention layer 3 is provided between the metal reflective film 4 and the junction layer 2.

<Compound Semiconductor Layer>

The compound semiconductor layer 20 is prepared by stacking a plurality of epitaxially grown layers, and is a stacked structure of compound semiconductors including a light-emitting layer 24.

AlGaInP layers or AlGaInAs layers or the like, which exhibit excellent light emission efficiency and have well-established substrate bonding techniques, can be used for the compound semiconductor layer 20. An AlGaInP layer is a layer formed from a material represented by a general formula $(Al_XGa_{1-X})_YIn_{1-Y}P$ ($0 \leq X \leq 1$ and $0 \leq Y \leq 1$). The composition of the layer is determined in accordance with the emission wavelength of the light-emitting diode. Similarly, in the case of an AlGaInAs layer used in fabricating a light-emitting diode having a red or infrared light emission, the composition of the material is determined in accordance with the emission wavelength of the light-emitting diode.

The compound semiconductor layer 20 is an n-type or p-type conduction-type compound semiconductor in which internal pn junctions are formed AlGaInAs includes AlGaAs and GaAs and the like.

The polarity of the surface of the compound semiconductor layer 20 may be either p-type of n-type.

In the example illustrated in FIG. 1, the compound semiconductor layer 20 is composed, for example, of a contact layer 22c, the upper current diffusion layer 6, a cladding layer 23a, the light-emitting layer 24, a cladding layer 23b, and the lower current diffusion layer 5. The upper current diffusion layer 6 may have a roughened surface for the purposes of light extraction. Further, the upper current diffusion layer 6 may have a structure containing two or more layers, including a surface-roughened layer.

The contact layer 22c is a layer for lowering the contact resistance of the ohmic electrode, and is, for example, formed from Si-doped n-type GaAs, with a carrier concentration of $2 \times 10^{18}$ cm and a layer thickness of 0.05 μm.

The upper current diffusion layer 6 is, for example, formed from Si-doped n-type $(Al_{0.5}Ga_{0.5})_{0.5}In_{0.5}P$, with a carrier concentration of $3 \times 10^{18}$ cm$^{-3}$ and a layer thickness of 5.0 μm.

The cladding layer 23a is, for example, formed from Si-doped n-type $Al_{0.45}Ga_{0.55}As$, with a carrier concentration of $2 \times 10^{18}$ cm and a layer thickness of 0.5 μm.

A layer formed from any of AlGaAs, InGaAs, GaInP and AlGaInP can be used as the light-emitting layer 24.

Specifically, the light-emitting layer 24 is composed, for example, of a stacked structure containing five undoped InGaAs layers as well layers and four $(Al_{0.15}Ga_{0.85})As$ layers as barrier layers, wherein the thickness of each of these layers is 0.007 μm. A guide layer may be provided between the light-emitting layer 24 and the cladding layer 23a. The guide layer is, for example, formed from $(Al_{0.25}Ga_{0.75})As$ with a layer thickness of 0.05 μm.

The light-emitting layer 24 may have a double hetero (DH) structure, a single quantum well (SQW) structure, or a multi quantum well (MQW) structure or the like. In this description, a double hetero structure describes a structure which can confine carriers that carry radiative recombination. Further, a quantum well structure describes a structure having a well layer and two barrier layers that sandwich the well layer therebetween, wherein an SQW structure has a single well layer, and an MQW structure has two or more well layers. Methods such as the MOCVD method can be used for forming the compound semiconductor layer 20.

In order to achieve light emission having excellent monochromaticity from the light-emitting layer 24, the use of an MQW structure as the light-emitting layer 24 is preferable.

The cladding layer 23b is, for example, formed from Mg-doped p-type $Al_{0.45}Ga_{0.55}As$, with a carrier concentration of $4 \times 10^{17}$ cm and a layer thickness of 0.5 p.m. A guide layer may be provided between the light-emitting layer 24 and the cladding layer 23b. The guide layer is, for example, formed from $(Al_{0.25}Ga_{0.75})As$ with a layer thickness of 0.3 μm.

The lower current diffusion layer 5 is, for example, formed from Mg-doped p-type GaP, with a carrier concentration of $5 \times 10^{18}$ cm$^{-3}$ and a layer thickness of 2 μm.

Further, the lower current diffusion layer 5 may be formed as a stacked structure. For example, a stacked structure composed of a layer formed from Mg-doped $(Al_{0.5}Ga_{0.5})_{0.5}In_{0.5}P$, with a carrier concentration of $4\times10^{17}$ cm$^{-3}$ and a layer thickness of 0.05 µm, a layer formed from Mg-doped $Ga_{0.7}In_{0.3}P$, with a carrier concentration of $4\times10^{17}$ cm$^{-3}$ and a layer thickness of 0.02 µm, and a layer formed from Mg-doped GaP, with a carrier concentration of $5\times10^{18}$ cm$^{-3}$ and a layer thickness of 3.5 µm may be used.

The configuration of the compound semiconductor layer 20 is not limited to the structure described above, and for example, the compound semiconductor layer 20 may also have a current inhibition layer or current constriction layer for restricting the region through which the device drive current is able to flow.

(Electrode Structure)

Figure 2A:
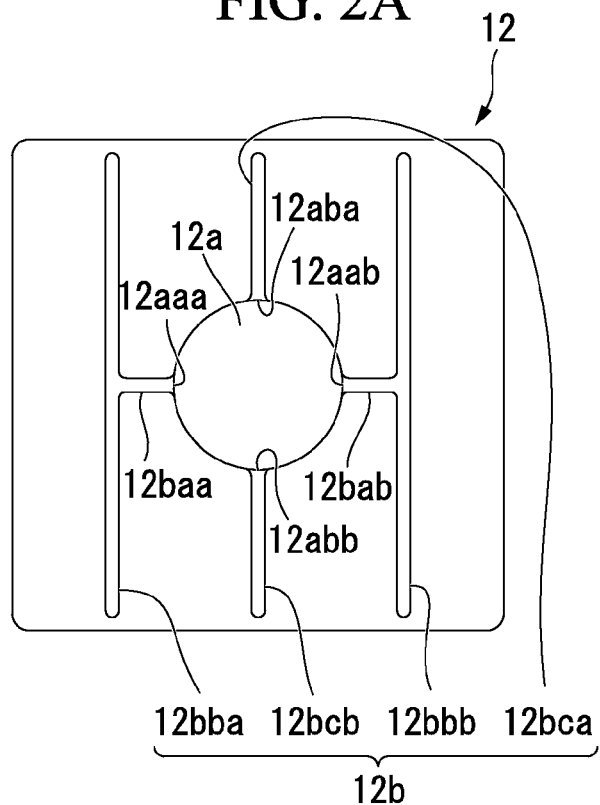
FIG. 2A is a schematic plan view of the surface electrode of the light-emitting diode of the first embodiment of the present invention.
Figure 2B:
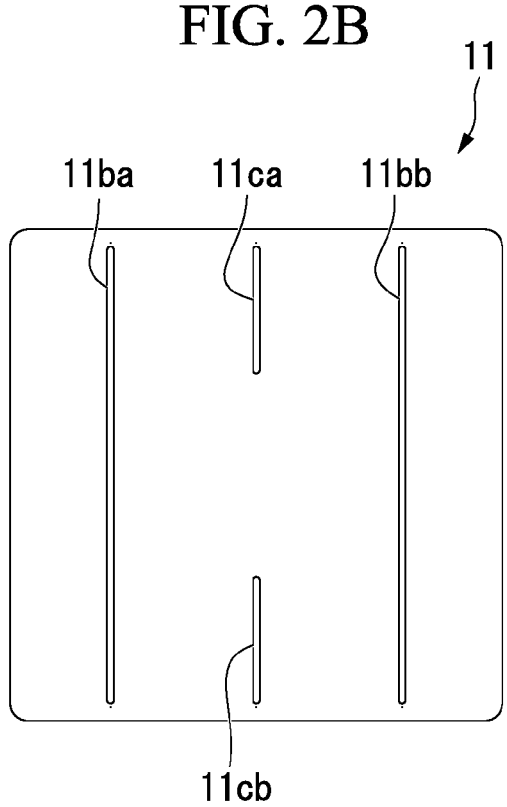
FIG. 2B is a schematic plan view of the ohmic electrode of the light-emitting diode.
Figure 2C:
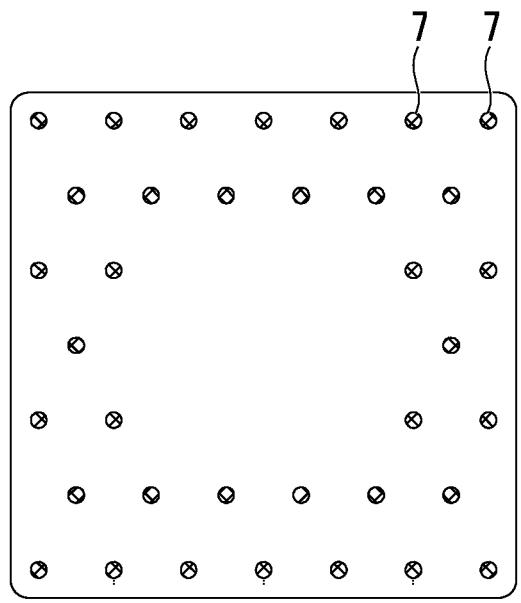
FIG. 2C is a schematic plan view of the ohmic contact electrodes of the light-emitting diode.
Figure 2D:
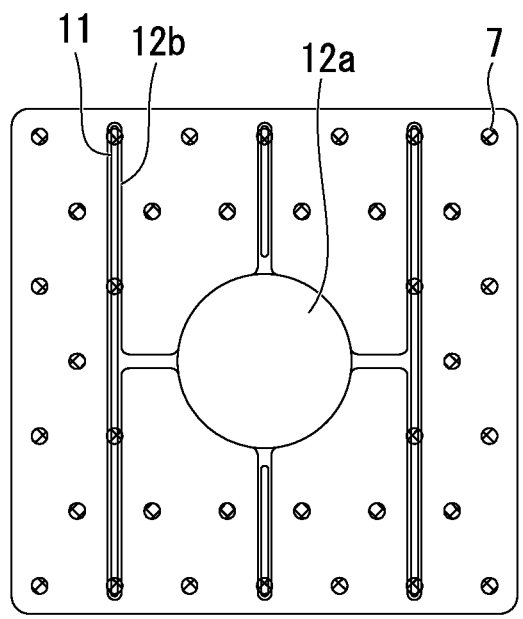
FIG. 2D is a schematic plan view showing the overlap of the surface electrode, the ohmic electrode and the ohmic contact electrodes.

FIG. 2A is a schematic plan view illustrating one example of the surface electrode of the present embodiment. FIG. 2B is a schematic plan view illustrating one example of the ohmic electrode of the present embodiment. FIG. 2C is a schematic plan view illustrating one example of the ohmic contact electrodes of the present embodiment. FIG. 2D is a schematic plan view showing the overlap of the surface electrode, the ohmic electrode and the ohmic contact electrodes.

<Surface Electrode>

As illustrated in FIG. 2A, the surface electrode 12 is composed of the pad portion 12a and the linear portions 12b connected to the pad portion 12a.

In the present embodiment, the pad portion 12a is circular when viewed in plan view, but other shapes besides a circular shape are also possible.

The linear portions 12b are composed of two first linear portions 12baa and 12bab, which extend in mutually opposite linear directions from peripheral edges (peripheral edge portions) 12aaa and 12aab on either side of the diameter of the pad portion, along a line that passes through the center of the circular pad portion 12a, and four second linear portions 12bba, 12bbb, 12bca and 12bcb, each of which extends in a direction orthogonal to the first linear portions 12baa and 12bab.

The second linear portions 12bba and 12bbb are connected to the end portions of the first linear portions 12baa and 12bab respectively at the opposite side from the peripheral edge portions 12aaa and 12aab, and are thus positioned distant from the pad portion 12a. On the other hand, the second linear portions 12bca and 12bcb extend from two peripheral edge portions 12aba and 12abb respectively, which are positioned respectively on the two circular arcs between the two peripheral edge portions 12aaa and 12aab. The second linear portion 12bca that extends from the peripheral edge portion 12aba and the second linear portion 12bcb that extends from the peripheral edge portion 12abb are positioned along a single line that extends in a direction parallel to the direction of extension of the second linear portions 12bba and 12bbb.

The linear portions 12b of the present embodiment are composed of two first linear portions and four second linear portions, but the invention is not limited to these numbers of portions.

The size of the pad portion 12a, in the case of a circular pad, is typically a diameter of about 50 to 150 µm.

Further, the width of the linear portions 12b is, for example, about 2 to 20 µm, in order to ensure that the portions have sufficient width to cover the width of the linear regions of the ohmic electrode 11. There is no necessity that all of the first linear portions and the second linear portions be the same width, but from the viewpoint of achieving uniform light extraction, the widths of those linear portions disposed in symmetrically opposing positions are preferably the same.

Examples of materials that can be used for the surface electrode include Au/Ti/Au (Au/Pt/Au, Au/Cr/Au, Au/Ta/Au, Au/W/Au, Au/Mo/Au) and the like.

<Ohmic Electrode>

As illustrated in FIG. 2B, the ohmic electrode 11 is composed of four linear regions 11ba, 11bb, 11ca and 11cb.

The ohmic electrode 11 of the present embodiment has a configuration composed of four linear regions, but the invention is not limited to this number of regions. The ohmic electrode 11 may be composed of discontinuous shapes aligned beneath the linear portions 12b of the surface electrode, for example an array of dot-shaped electrodes.

Further, the linear regions of the ohmic electrode 11 are disposed in positions which, when viewed in plan view, do not overlap with the pad portion 12a of the surface electrode 12, but are covered by the four second linear portions 12bba, 12bbb, 12bca and 12bcb of the linear portions 12b of the surface electrode 12.

In other words, the two long linear regions 11ba and 11bb are positioned directly beneath the second linear portions 12bba and 12bbb respectively, and the two short linear regions 11ca and 11cb are positioned directly beneath the second linear portions 12bca and 12bcb respectively.

The reason that the ohmic electrode 11 is disposed in positions which, when viewed in plan view, do not overlap with the pad portion 12a of the surface electrode 12 is because if the ohmic electrode 11 is disposed in a position that overlaps with the pad portion 12a, a large proportion of the light that is emitted from directly beneath the pad portion is absorbed by the pad portion, causing a deterioration in the light extraction efficiency, which is better avoided. The material of the surface electrode 12 is a material which, when brought into direct contact with the compound semiconductor layer, is unlikely to form an ohmic junction, but rather tends to form a Schottky junction. Consequently, the resistance of the pad portion 12a, which contacts the compound semiconductor layer without the ohmic electrode disposed therebetween, is larger than the resistance of the portions of the ohmic electrode 11. As a result, essentially no current flows beneath the pad portion 12a, with the current flowing through the ohmic electrode 11.

The width of the linear regions that constitute the ohmic electrode 11 are typically about 1 to 10 µm in order to ensure that the regions are sufficiently narrow so as to be covered by the width of the linear portions of the surface electrode 12. There is no necessity that all of the linear regions be the same width, but from the viewpoint of achieving uniform light extraction, the widths of those linear regions disposed in symmetrically opposing positions are preferably the same.

Examples of materials that can be used for the ohmic electrode include AuGeNi, AuGe, AuNiSi and AuSi.

<Ohmic Contact Electrodes>

As illustrated in FIG. 2C, the ohmic contact electrodes 7 are composed of a plurality of conductive members which appear as dot shapes in plan view, and these conductive members are embedded inside a transparent dielectric film described below.

When the dot-shaped conductive members (namely, the dispersed conductive members) that constitute the ohmic contact electrodes 7 are viewed in plan view, 5% or more and 40% or less of the ohmic contact electrodes are disposed in positions that overlap with the linear portions 12b of the surface electrode 12, whereas the remainder of the ohmic contact electrodes 7 are disposed in positions that do not overlap with the linear portions 12b of the surface electrode 12.

There are no particular limitations on the shapes of the ohmic contact electrodes 7, and circular cylindrical shapes, oval cylindrical shapes, donut shapes, or linear shapes or the like may be used.

In the example illustrated in FIG. 2A to 2D, the plurality of ohmic contact electrodes 7 are arranged such that a plurality of rows of ohmic contact electrodes 7 that are aligned in parallel to the first linear portions 12baa and 12bab of the surface electrode 12 are aligned along a direction parallel to the second linear portions 12bba, 12bbb, 12bca and 12bcb, with each of the plurality of rows of ohmic contact electrodes 7 alternately offset by a half period.

More specifically, the number of ohmic contact electrodes 7 in each row, counting downward in order from the top of the page, is 7 (first row), 6 (second row), 4 (third row), 2 (fourth row), 4 (fifth row), 6 (sixth row) and 7 (seventh row). When viewed in plan view, 3 alternating electrodes in each of the first row and the seventh row are disposed in positions that overlap with the linear portions. Further, when viewed in plan view, 2 electrodes in each of the third row and the fifth row are disposed in positions that overlap with the linear portions. In contrast, in the second row, the sixth row and the fourth row, none of the ohmic contact electrodes overlaps with the linear portions. When viewed in plan view, those ohmic contact electrodes disposed in positions that overlap with the linear portions adopt a configuration that surrounds the pad portion 12a.

In the example illustrated in FIG. 2A to 2D, of the total of 36 ohmic contact electrodes 7, 10 of the ohmic contact electrodes are disposed in positions that overlap with the linear portions in plan view, meaning about 28% of the ohmic contact electrodes are disposed in positions that overlap with the linear portions in plan view.

The dot-shaped conductive members that constitute the ohmic contact electrodes 7 are formed, for example, as circular cylindrical members with a diameter of about 5 to 20 μm.

Further, in a linearly arranged group of these dot-shaped conductive members, the distance between adjacent conductive members is, for example, about 5 to 40 μm.

The reason that the ohmic contact electrodes 7 are disposed in positions which, when viewed in plan view, do not overlap with the pad portion 12a of the surface electrode 12 is because if the ohmic contact electrodes 7 are disposed in positions that overlap with the pad portion 12a, a large proportion of the light that is emitted from directly beneath the pad portion is absorbed by the pad portion, causing a deterioration in the light extraction efficiency, which is better avoided.

Examples of materials that can be used for the ohmic contact electrodes include AuBe and AuZn and the like.

[Light-Emitting Diode (Other Embodiments)]

FIG. 3 to FIG. 7 are diagrams illustrating the electrode positioning structure in other embodiments of the present invention, with each diagram corresponding with FIG. 2D of the first embodiment.

Figure 3:
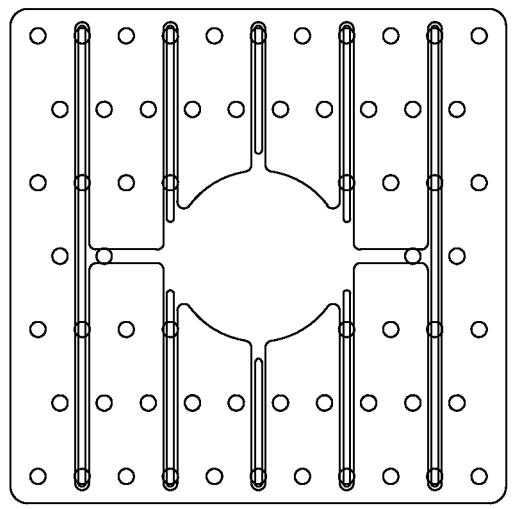
FIG. 3 is a schematic plan view illustrating another embodiment of the electrode structure of a light-emitting diode of the present invention (showing only the electrode positioning structure).

The embodiment illustrated in FIG. 3 includes eight linear portions that correspond with the second linear portions of the surface electrode of the first embodiment. In other words, this embodiment has two long second linear portions and six short second linear portions.

In the embodiment illustrated in FIG. 3, in a similar manner to that observed in the first embodiment, the plurality of ohmic contact electrodes are arranged such that a plurality of rows of ohmic contact electrodes, which are aligned in parallel to the linear portions corresponding with the first linear portions of the surface electrode of the first embodiment, are aligned along a direction parallel to the linear portions corresponding with the second linear portions, with each of the plurality of rows of ohmic contact electrodes alternately offset by a half period.

More specifically, the number of ohmic contact electrodes in each row, counting downward in order from the top of the page, is 11 (first row), 10 (second row), 8 (third row), 4 (fourth row), 8 (fifth row), 10 (sixth row) and 11 (seventh row). When viewed in plan view, 5 alternating electrodes in each of the first row and the seventh row are disposed in positions that overlap with the linear portions. Further, when viewed in plan view, 4 electrodes in each of the third row and the fifth row are disposed in positions that overlap with the linear portions. Furthermore, one electrode in the fifth row is disposed in a position that overlaps with the linear portions. In contrast, in the second row and the sixth row, none of the ohmic contact electrodes overlaps with the linear portions.

In the example illustrated in FIG. 3, of the total of 62 ohmic contact electrodes, 18 of the ohmic contact electrodes are disposed in positions that overlap with the linear portions in plan view, meaning about 31% of the ohmic contact electrodes are disposed in positions that overlap with the linear portions in plan view.

Figure 4:
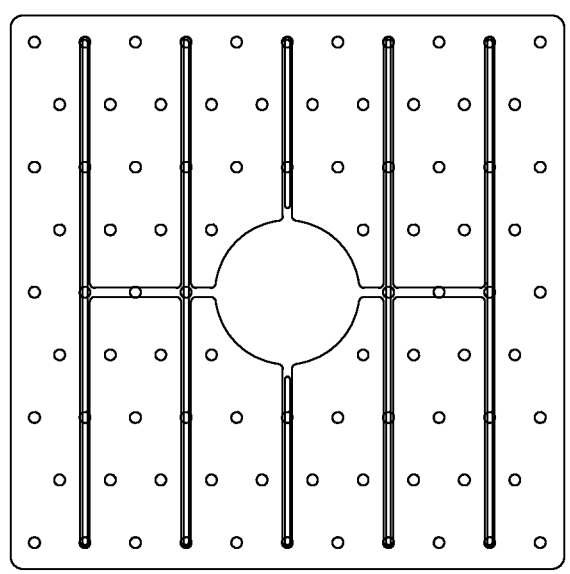
FIG. 4 is a schematic plan view illustrating another embodiment of the electrode structure of a light-emitting diode of the present invention (showing only the electrode positioning structure).

The embodiment illustrated in FIG. 4 includes six linear portions that correspond with the second linear portions of the surface electrode of the first embodiment. In other words, this embodiment has four long second linear portions and two short second linear portions.

In the embodiment illustrated in FIG. 4, in a similar manner to that observed in the first embodiment, the plurality of ohmic contact electrodes are arranged such that a plurality of rows of ohmic contact electrodes, which are aligned in parallel to the linear portions corresponding with the first linear portions of the surface electrode of the first embodiment, are aligned along a direction parallel to the linear portions corresponding with the second linear portions, with each of the plurality of rows of ohmic contact electrodes alternately offset by a half period.

More specifically, the number of ohmic contact electrodes in each row, counting downward in order from the top of the page, is 11 (first row), 10 (second row), 11 (third row), 8 (fourth row), 8 (fifth row), 8 (sixth row), 11 (seventh row), 10 (eighth row) and 11 (ninth row).

When viewed in plan view, 5 alternating electrodes in each of the first row, the third row, the seventh row and the ninth row are disposed in positions that overlap with the linear portions. Further, when viewed in plan view, 6 electrodes in the fifth row are disposed in positions that overlap with the linear portions. In contrast, in the second row, the fourth row, the sixth row and the eighth row, none of the ohmic contact electrodes overlaps with the linear portions.

In the example illustrated in FIG. 4, of the total of 88 ohmic contact electrodes, 26 of the ohmic contact electrodes are disposed in positions that overlap with the linear portions in plan view, meaning about 30% of the ohmic contact electrodes are disposed in positions that overlap with the linear portions in plan view.

Figure 5:
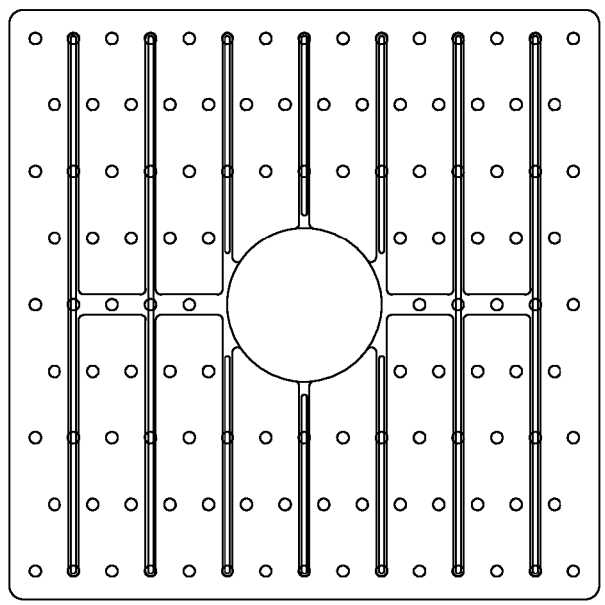
FIG. 5 is a schematic plan view illustrating another embodiment of the electrode structure of a light-emitting diode of the present invention (showing only the electrode positioning structure).

The embodiment illustrated in FIG. 5 includes ten linear portions that correspond with the second linear portions of the surface electrode of the first embodiment. In other words, this embodiment has four long second linear portions and six short second linear portions.

In the embodiment illustrated in FIG. 5, in a similar manner to that observed in the first embodiment, the plurality of ohmic contact electrodes are arranged such that a plurality of rows of ohmic contact electrodes, which are aligned in parallel to the linear portions corresponding with the first linear portions of the surface electrode of the first embodiment, are aligned along a direction parallel to the linear portions corresponding with the second linear portions, with each of the plurality of rows of ohmic contact electrodes alternately offset by a half period.

More specifically, the number of ohmic contact electrodes in each row, counting downward in order from the top of the page, is 15 (first row), 14 (second row), 15 (third row), 10 (fourth row), 10 (fifth row), 10 (sixth row), 15 (seventh row), 14 (eighth row) and 15 (ninth row). When viewed in plan view, 7 alternating electrodes in each of the first row, the third row, the seventh row and the ninth row are disposed in positions that overlap with the linear portions. Further, when viewed in plan view, 8 electrodes in the fifth row are disposed in positions that overlap with the linear portions. In contrast, in the second row, the fourth row, the sixth row and the eighth row, none of the ohmic contact electrodes overlaps with the linear portions.

In the example illustrated in FIG. 5, of the total of 118 ohmic contact electrodes, 36 of the ohmic contact electrodes are disposed in positions that overlap with the linear portions in plan view, meaning about 31% of the ohmic contact electrodes are disposed in positions that overlap with the linear portions in plan view.

Figure 6:
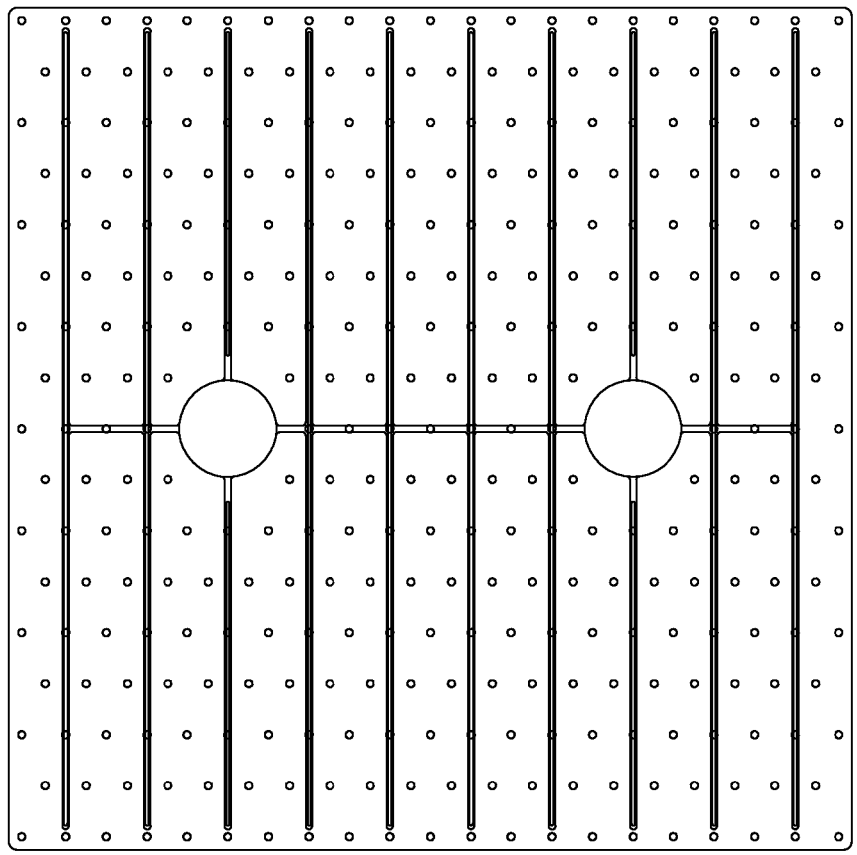
FIG. 6 is a schematic plan view illustrating another embodiment of the electrode structure of a light-emitting diode of the present invention (showing only the electrode positioning structure).

The embodiment illustrated in FIG. 6 includes two surface electrode pad portions, and includes three linear portions corresponding with the first linear portions of the surface electrode of the first embodiment, one of which is common to the two pads. Further, this embodiment includes 12 linear portions that correspond with the second linear portions of the surface electrode of the first embodiment. In other words, this embodiment has eight long second linear portions and four short second linear portions. The embodiment illustrated in FIG. 6 is one example of a configuration in which the pad portion is composed of a plurality of circular pads, but configurations with three or more pads are also possible.

In the embodiment illustrated in FIG. 6, in a similar manner to that observed in the first embodiment, the plurality of ohmic contact electrodes are arranged such that a plurality of rows of ohmic contact electrodes, which are aligned in parallel to the linear portions corresponding with the first linear portions of the surface electrode of the first embodiment, are aligned along a direction parallel to the linear portions corresponding with the second linear portions, with each of the plurality of rows of ohmic contact electrodes alternately offset by a half period.

More specifically, the number of ohmic contact electrodes in each row, counting downward in order from the top of the page, is 21 (first row), 20 (second row), 21 (third row), 20 (fourth row), 21 (fifth row), 20 (sixth row), 21 (seventh row), 16 (eighth row), 15 (ninth row), 16 (tenth row), 21 (eleventh row), 20 (twelfth row), 21 (thirteenth row), 20 (fourteenth row), 21 (fifteenth row), 20 (sixteenth row) and 21 (seventeenth row). When viewed in plan view, 10 alternating electrodes in each of the third row, the fifth row, the seventh row, the eleventh row, the thirteenth row and the fifteenth row are disposed in positions that overlap with the linear portions. Further, when viewed in plan view, 13 electrodes in the ninth row are disposed in positions that overlap with the linear portions. In contrast, in the first row, the second row, the fourth row, the sixth row, the eighth row, the tenth row, the twelfth row, the fourteenth row and the sixteenth row, none of the ohmic contact electrodes overlaps with the linear portions.

In the example illustrated in FIG. 4, of the total of 335 ohmic contact electrodes, 73 of the ohmic contact electrodes are disposed in positions that overlap with the linear portions in plan view, meaning about 22% of the ohmic contact electrodes are disposed in positions that overlap with the linear portions in plan view.

Figure 7:
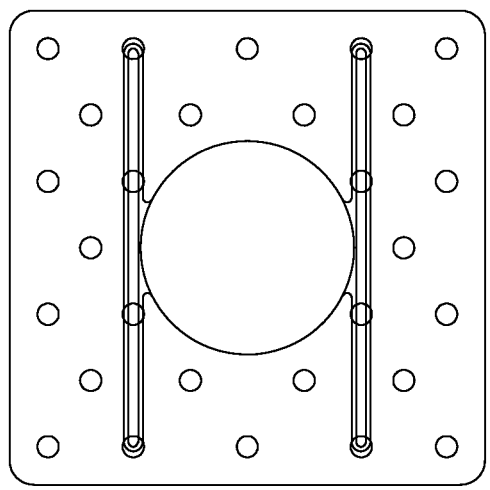
FIG. 7 is a schematic plan view illustrating another embodiment of the electrode structure of a light-emitting diode of the present invention (showing only the electrode positioning structure).

In the embodiment illustrated in FIG. 7, the linear portions are composed of two second linear portions which extend along lines that are tangent to the peripheral edges of the circular pad portion. In other words, this embodiment is a configuration that includes no linear portions corresponding with the first linear portions of the surface electrode of the first embodiment, but has two linear portions corresponding with the second linear portions of the surface electrode.

In the embodiment illustrated in FIG. 7, in a similar manner to that observed in the first embodiment, the plurality of ohmic contact electrodes are arranged such that a plurality of rows of ohmic contact electrodes, which are aligned in parallel to the linear portions corresponding with the first linear portions of the surface electrode of the first embodiment, are aligned along a direction parallel to the linear portions corresponding with the second linear portions, with each of the plurality of rows of ohmic contact electrodes alternately offset by a half period.

More specifically, the number of ohmic contact electrodes in each row, counting downward in order from the top of the page, is 5 (first row), 4 (second row), 4 (third row), 2 (fourth row), 4 (fifth row), 4 (sixth row) and 5 (seventh row). When viewed in plan view, 2 alternating electrodes in each of the first row, the third row, the fifth row and the seventh row are disposed in positions that overlap with the linear portions. In contrast, in the second row, the fourth row and the sixth row, none of the ohmic contact electrodes overlaps with the linear portions.

In the example illustrated in FIG. 7, of the total of 28 ohmic contact electrodes, 8 of the ohmic contact electrodes are disposed in positions that overlap with the linear portions in plan view, meaning about 29% of the ohmic contact electrodes are disposed in positions that overlap with the linear portions in plan view.

Figure 8A:
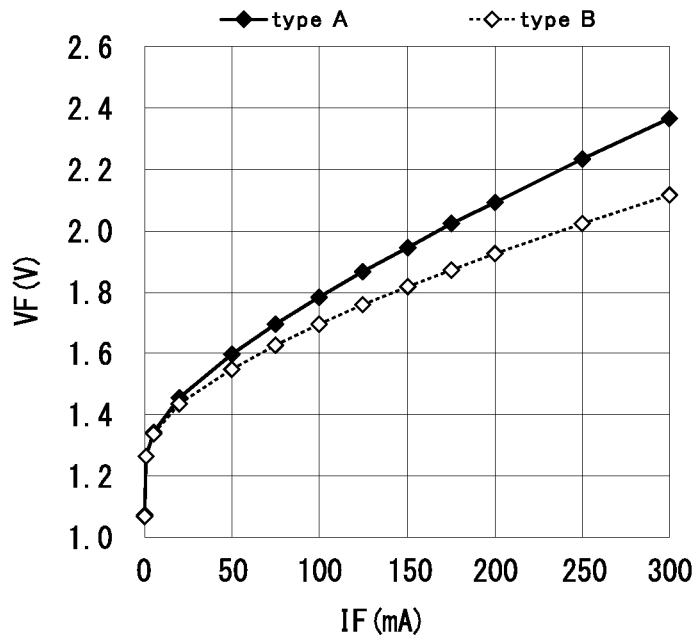
FIG. 8A is a graph illustrating the $I_F$-$V_F$ characteristics of a light-emitting diode (type A) having the conventional electrode positioning structure illustrated in FIG. 9, and a light-emitting diode (type B) having the electrode positioning structure of the present invention illustrated in FIG. 2A to 2D.
Figure 8B:
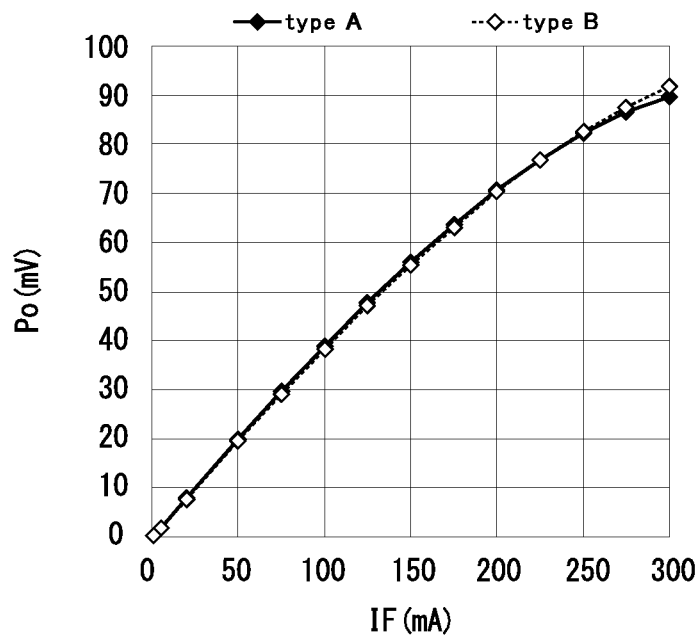
FIG. 8B is a graph illustrating the $I_F$-Po characteristics of a light-emitting diode (type A) having the conventional electrode positioning structure illustrated in FIG. 9, and a light-emitting diode (type B) having the electrode positioning structure of the present invention illustrated in FIG. 2.
Figure 9:
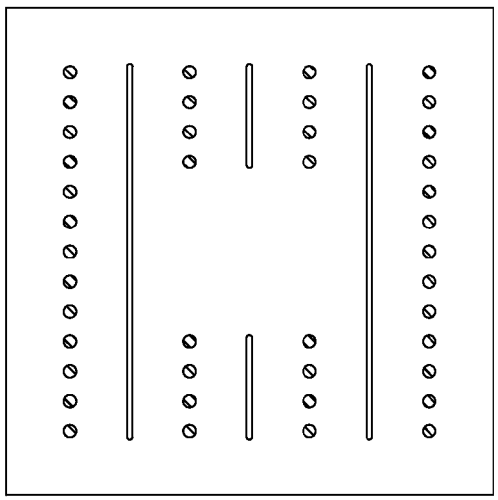
FIG. 9 is a schematic plan view illustrating a conventional electrode positioning structure.

FIG. 8A and FIG. 8B illustrate the $I_F$-$V_F$ characteristics and the $I_F$-Po characteristics respectively of a light-emitting diode (type A) having the conventional electrode positioning structure illustrated in FIG. 9, and a light-emitting diode (type B) having the electrode positioning structure of the present invention illustrated in FIG. 2A to 2D. In the present description, a conventional electrode positioning structure means an electrode positioning structure in which the ohmic contact electrodes are formed only in positions that do not overlap with the linear portions of the surface electrode.

As described above, in the electrode positioning structure illustrated in FIG. 2A to 2D, about 28% of the ohmic contact electrodes are disposed in positions that overlap with the linear portions when viewed in plan view.

The light-emitting diode (type A) having the conventional electrode positioning structure illustrated in FIG. 9 is similar to the present invention in that the ohmic contact electrodes are formed in positions which, when viewed in plan view, do not overlap with the pad portion of the surface electrode, but differs from the present invention in that the ohmic contact electrodes are formed only in positions that do not overlap with the linear portions of the surface electrode.

The "type B" light-emitting diode is as described below.

For the support substrate, a substrate having a Pt layer of 1 µm and an Au layer of 1 µm in that order on each surface of a Ge substrate was used.

An epitaxial wafer with an emission wavelength of 620 nm was prepared by sequentially stacking compound semiconductor layers on top of a GaAs substrate formed from Si-doped n-type monocrystalline GaAs.

In the GaAs substrate, the growth plane was inclined 15° from the (100) plane toward the (0-1-1) direction, and the carrier concentration was $1 \times 10^{18}$ cm. The compound semiconductor layers included an n-type buffer layer formed from Si-doped GaAs, an etching stop layer formed from Si-doped $(Al_{0.5}Ga_{0.5})_{0.5}In_{0.5}P$, an n-type contact layer formed from Si-doped GaAs, an n-type surface surface-roughened layer formed from Si-doped $(Al_{0.5}Ga_{0.5})_{0.5}In_{0.5}P$, an n-type cladding layer formed from Si-doped $Al_{0.5}In_{0.5}P$, a light-emitting layer composed of 20 well layer/barrier layer pairs formed from $(Al_{0.1}Ga_{0.9})_{0.5}In_{0.5}P/(Al_{0.5}Ga_{0.5})_{0.5}In_{0.5}P$, a p-type cladding layer $23b$ formed from $Al_{0.5}In_{0.5}P$, and the current diffusion layer 5 formed from Mg-doped p-type GaP.

The buffer layer formed from GaAs had a carrier concentration of about $1 \times 10^{18}$ cm$^{-3}$ and a thickness of about 0.5 µm. The etching stop layer had a carrier concentration of about $1 \times 10^{18}$ cm$^{-3}$ and a thickness of about 0.5 µm. The contact layer had a carrier concentration of about $1 \times 10^{18}$ cm$^{-3}$ and a thickness of about 0.05 µm. The surface-roughened layer had a carrier concentration of $1 \times 10^{18}$ cm$^{-3}$ and a thickness of about 3 µm. The upper cladding layer had a carrier concentration of about $2 \times 10^{18}$ cm$^{-3}$ and a thickness of about 0.5 µm. Each well layer was an undoped $(Al_{0.1}Ga_{0.9})_{0.5}In_{0.5}P$ layer with a thickness of about 5 nm, and each barrier layer was an undoped $(Al_{0.5}Ga_{0.5})_{0.5}In_{0.5}P$ layer with a thickness of about 5 nm. Twenty pairs of the well layer and the barrier layer were stacked alternately. The lower cladding layer had a carrier concentration of $8 \times 10^{17}$ cm$^{-3}$ and a thickness of about 0.5 µm.

The $SiO_2$ film 8 and the ohmic contact electrodes 7 formed from an AuBe alloy were formed on the current diffusion layer 5. The $SiO_2$ film 8 had a thickness of 0.3 µm, and the circular cylindrical conductive members that constituted the ohmic contact electrodes 7 had a diameter of 9 µm, with a distance between linearly adjacent conductive members of 43 µm. The metal reflective film 4 composed of an Au film with a thickness of 0.7 µm was formed on the $SiO_2$ film 8 and the ohmic contact electrodes 7 using a vapor deposition method. The diffusion prevention layer 3 composed of a Ti film with a thickness of 0.5 µm was then formed on the metal reflective film 4 using a vapor deposition method. Subsequently, the junction layer 2 formed from AuGe with a thickness of 1.0 µm was formed on the diffusion prevention layer 3 using a vapor deposition method.

The structure composed of the compound semiconductor layers and the metal reflective film and the like formed on the GaAs substrate, and the support substrate were superimposed facing each other, the resulting structure was transported into a reduced pressure apparatus, and a load of 500 kg was applied while the structure was heated at 400° C., thereby joining the two structures together to form a junction structure.

A vapor deposition method was then used to form the ohmic electrode 11 from an AuGeNi alloy, having the pattern illustrated in FIG. 2B and a thickness of 0.1 µm, on the opposite surface of the compound semiconductor layer 20 from the ohmic contact electrodes 7.

Each of the four linear regions had a width of 4 µm, the length of each of the linear regions 11$ba$ and 11$bb$ was 270 µm, and the length of each of the linear regions 11$ca$ and 11$cb$ was 85 µm.

Further, the closest distance between the linear regions 11$ba$ and 11$bb$ and the pad portion 12$a$ of the surface electrode 12 was 45 µm, the closest distance between the linear regions 11$ca$ and 11$cb$ and the pad portion 12$a$ of the surface electrode 12 was 10 µm.

The closest distance between the linear regions 11$ba$ and 11$bb$ and the pad portion 12$a$ of the surface electrode 12 matches the length of the first linear portions 12$baa$ and 12$bab$ of the surface electrode 12.

Using a vapor deposition method, the surface electrode 12 composed of the pad portion 12$a$ and the linear portions 12$b$, and having the pattern illustrated in FIG. 2A and a thickness of 1.6 µm, was formed on the opposite surface of the compound semiconductor layer 20 from the ohmic contact electrodes 7, so as to cover the ohmic electrode 11.

The diameter of the pad portion 12$a$ was 100 µm, and the width of the linear portions 12$b$ was 8 µm for both the first linear portions and the second linear portions.

Further, the length of each of the first linear portions 12$baa$ and 12$bab$ was 43 µm, the length of each of the second linear portions 12$bba$ and 12$bbb$ was 270 µm, and the length of each of the second linear portions 12$bca$ and 12$bcb$ was 100 µm.

The light-emitting diode of "type A" differs from the light-emitting diode of "type B" only in the positional arrangement of the ohmic contact electrodes.

The distance between adjacent ohmic contact electrodes on each row was 12 µm.

As illustrated in FIG. 8B, in terms of the light emission output (Po), there is almost no difference between the light-emitting diode of the present invention (type B) and the conventional light-emitting diode (type A) up to a forward current ($I_F$) of 300 mA.

In contrast, as illustrated in FIG. 8A, in terms of the forward voltage ($V_F$), the light-emitting diode of the present invention (type B) is clearly superior to the conventional light-emitting diode (type A) for forward current ($I_F$) values exceeding 20 mA, with the $V_F$ value for the light-emitting diode of the present invention (type B) about 7% lower than the $V_F$ value of the conventional light-emitting diode (type A) up to a forward current ($I_F$) of 150 mA, and the $V_F$ value for the light-emitting diode of the present invention (type B) then about 10% lower than the $V_F$ value of the conventional light-emitting diode (type A) up to a forward current ($I_F$) of 300 mA.

As shown above, the light-emitting diode (type B) having the electrode positioning structure of the present invention has superior forward voltage ($V_F$) characteristics to the light-emitting diode (type A) having a conventional electrode positioning structure.

Figure 10:
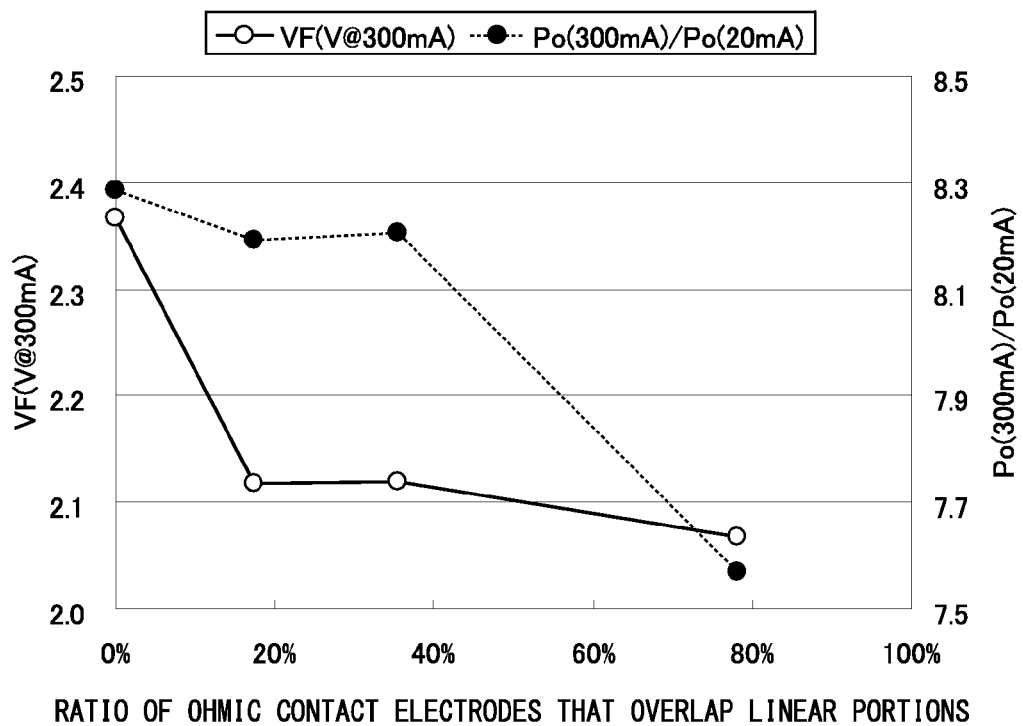
FIG. 10 is a graph illustrating the relationship of the forward voltage ($V_F$) and the light emission output (Po) relative to the proportion (ratio) of ohmic contact electrodes disposed in positions which overlap with the linear portions in a light-emitting diode having the electrode positioning structure of the present invention illustrated in FIG. 2A to 2B.

FIG. 10 is a graph illustrating the relationship of the forward voltage ($V_F$) and the light emission output (Po) relative to the proportion (ratio) of ohmic contact electrodes disposed in positions which, when viewed in plan view, overlap with the linear portions in a light-emitting diode having the electrode positioning structure of the present invention illustrated in FIG. 2A to 2D. The positional arrangement of the ohmic contact electrodes was altered so that there was no change in the configurations of the surface electrode and the ohmic electrode, and no change in the number of dot-shaped ohmic contact electrodes, with only a change in the ratio of ohmic contact electrodes disposed in positions that overlap with the linear portions.

The forward voltage ($V_F$) values are values when the forward current ($I_F$) was 300 mA, and the light emission output (Po) values represent ratios of the value at 300 mA relative to the value at 20 mA.

As illustrated in FIG. 10, as the ratio of ohmic contact electrodes disposed in positions that overlap with the linear portions increases, the forward voltage ($V_F$) decreases, but the light emission output (Po) also decreases. However, this decrease in the light emission output (Po) is small until the ratio of ohmic contact electrodes disposed in positions that overlap with the linear portions reaches about 40%.

In order to obtain an effect wherein a decrease in the forward voltage ($V_F$) of about 3% or more is obtained, while the light emission output (Po) is maintained at 90% or more of the light emission output (Po) observed when there are no ohmic contact electrodes disposed in positions that overlap with the linear portions (when the horizontal axis value in FIG. 10 is 0%), the ratio of ohmic contact electrodes disposed in positions that overlap with the linear portions must be 5% or more and 40% or less.

<Transparent Dielectric Film>

The transparent dielectric film 8 is formed so as to fill the spaces between the dot-shaped conductive members that constitute the ohmic contact electrodes 7.

Examples of materials that can be used for the transparent dielectric film 8 include ITO, $SiO_2$, IZO, $Si_3N_4$, $TiO_2$ and TiN.

The thickness of the transparent dielectric film 8 can be set, for example, to 0.05 to 1.0 μm.

Figure 11:
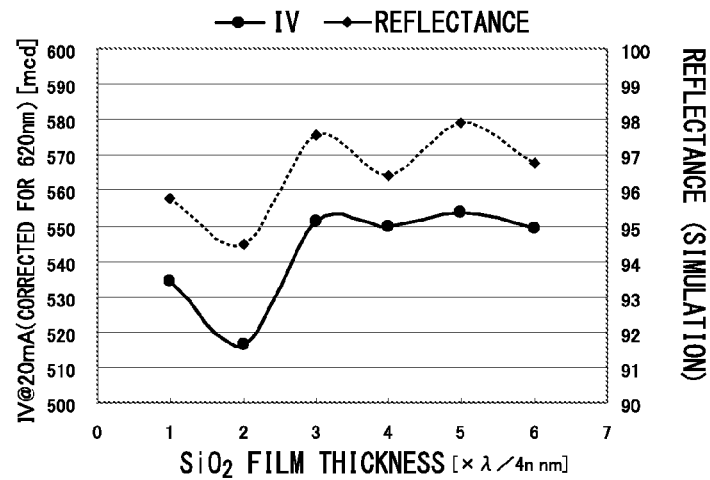
FIG. 11 is a graph illustrating the relationship between the thickness of a transparent dielectric film formed from $SiO_2$, and the reflectance (right vertical axis) and the luminous intensity (left vertical axis).

FIG. 11 illustrates the relationship between the thickness of a transparent dielectric film formed from $SiO_2$, and the reflectance (right vertical axis) and the luminous intensity (left vertical axis). The horizontal axis represents the thickness of the transparent dielectric film, and is shown as a length relative to $\lambda/4n$ (wherein n is the refractive index of the transparent dielectric film) of the emission wavelength (620 nm was used).

The reflectance indicates results calculated by computer simulation, and the luminous intensity represent test results at a forward current ($I_F$) of 20 mA, corrected for a wavelength of 620 nm.

The computer simulation was performed under conditions including a refractive index for $SiO_2$ of 1.474 and a wavelength of the reflected light of 630 nm.

As illustrated in FIG. 11, it was evident that the reflectance was high when the thickness of the transparent dielectric film was $\lambda/4n$ (nm), and that the reflectance was even higher when the thickness was $3\lambda/4n$ (nm) and $5\lambda/4n$ (nm).

Further, it was also evident that the luminous intensity was high when the thickness was $\lambda/4n$ (nm), and was even higher when the thickness was $3\lambda/4n$ (nm) and $5\lambda/4n$ (nm). In this manner, the luminous intensity was higher when the thickness of the transparent dielectric film was $3\lambda/4n$ (nm) and $5\lambda/4n$ (nm) than when the thickness was $\lambda/4n$ (nm).

Accordingly, the thickness of the transparent dielectric film is preferably thicker than $\lambda/4n$ (nm), and is preferably either $3\lambda/4n$ (nm) or $5\lambda/4n$ (nm).

In the electrode positioning structure of the present invention, 5% or more and 40% or less of the ohmic contact electrodes exist in positions that overlap with (are essentially directly beneath) the linear portions of the surface electrode, and the device surface-side ohmic electrode is positioned directly beneath the linear portions. Accordingly, in a light-emitting diode having the electrode positioning structure of the present invention, the ratio with which the ohmic contact electrodes and the ohmic electrode adopt an aligned relationship in a direction orthogonal to the device surface (namely, a direction parallel to the thickness direction of the transparent dielectric film (hereafter simply referred to as "the thickness direction")) is higher than the ratio observed in a conventional electrode positioning structure. As a result, the ratio of current that flows between the ohmic contact electrodes and the ohmic electrode in the thickness direction of the transparent dielectric film is larger than that observed for a conventional electrode positioning structure. When the current that flows between the ohmic contact electrodes and the ohmic electrode flows along the thickness direction of the transparent dielectric film, the current flows through the compound semiconductor layers along the shortest possible distance. This results in a decrease in the forward voltage ($V_F$), and therefore it is desirable that the ratio of current flowing in the thickness direction of the transparent dielectric film is high.

Further, the fact that the ratio of current that flows between the ohmic contact electrodes and the ohmic electrode, which are aligned in the thickness direction of the transparent dielectric film, is larger than that observed for a conventional electrode positioning structure means that the proportion of light emitted between the ohmic contact electrodes and the ohmic electrode that are aligned in the thickness direction of the transparent dielectric film also increases. When light emission between the ohmic contact electrodes and the ohmic electrode that are aligned in the thickness direction of the transparent dielectric film travels toward the metal reflective film in the thickness direction of the transparent dielectric film, the light contacts the ohmic contact electrodes, and it is thought that this results in a reduction in the proportion of light traveling in the thickness direction of the transparent dielectric film. In other words, it is thought that there is an increase in the proportion of light traveling through the transparent dielectric film in an oblique direction relative to the thickness direction of the transparent dielectric film. In the relationship between the thickness of the transparent dielectric layer ($SiO_2$) and the reflectance illustrated in FIG. 11, at a thickness of $\lambda/4n$ (nm), the proportion of the variation in the reflectance upon variation in the $SiO_2$ film thickness is large. In contrast, when the thickness is $3\lambda/4n$ (nm) or $5\lambda/4n$ (nm), the proportion of the variation in the reflectance upon variation in the $SiO_2$ film thickness is much smaller. Accordingly, in the structure of the present invention, in which there is an increase in the proportion of light traveling through the transparent dielectric film in an oblique direction relative to the thickness direction of the transparent dielectric film, a thickness for the transparent dielectric layer of $3\lambda/4n$ (nm) or $5\lambda/4n$ (nm) is advantageous. In this manner, the electrode positioning structure and the thickness of the transparent dielectric film exhibit a synergistic effect. Based on test results, it was evident that the light emission characteristics were more favorable when the thickness of the transparent dielectric film was greater than $\lambda/4n$ (nm), and particularly $3\lambda/4n$ (nm) or $5/4n$ (nm).

<Metal Reflective Film>

The metal reflective film 4 reflects light from the light emitting layer 24 in the front direction f, meaning the light extraction efficiency in the front direction f can be improved, thereby increasing the brightness of the light emitting diode.

Examples of materials that can used for the metal reflective film 4 include metals such as gold, AgPdCu alloy (APC), copper, silver, aluminum, and alloys of these metals. These materials exhibit a high degree of optical reflectance, enabling a reflectance of 90% or higher to be achieved.

The thickness of the metal reflective film 4 can be set, for example, to 0.1 to 1.0 μm.

<Diffusion Prevention Layer>

The diffusion prevention layer 3 can inhibit metal diffusing from the substrate side and reacting with the metal reflective film 4.

Examples of materials that can be used for the diffusion prevention layer 3 include nickel, titanium, platinum, chromium, tantalum, tungsten and molybdenum.

The diffusion prevention layer may also employ a combination of two or more types of metals. For example, by combining a platinum layer and a titanium layer as a first diffusion prevention layer 3a and a second diffusion prevention layer 3b as illustrated in FIG. 1, the barrier performance can be improved.

Even if a diffusion prevention layer is not provided, a similar function to the diffusion prevention layer can be imparted to the junction layer by adding the above materials to the junction layer.

The thickness of the diffusion prevention layer 3 can be set, for example, to 0.02 to 0.5 μm.

<Junction Layer>

The junction layer 2 is a layer used for joining the structure composed of the compound semiconductor layer 20 including the light-emitting layer 24 to a support substrate 10.

Examples of materials that can be used for the junction layer 2 include materials that are chemically stable and have a low melting point, such as Au and Au-based eutectic metals. Specific examples of gold-based eutectic metals include eutectic compositions of alloys such as AuGe, AuSn, AuSi and AuIn. Combinations of two or more types of metals, such as the combination illustrated in FIG. 1 of an AuGe layer and an Au layer as a first junction layer 2a and a second junction layer 2b, can also be used.

The thickness of the junction layer 2 can be set, for example, to 0.3 to 3.0 μm.

<Semiconductor Substrate>

Examples of the semiconductor substrate that constitutes the support substrate include a Ge substrate, Si substrate, GaP substrate and GaAs substrate.

<Light-Emitting Diode Lamp>

Although not illustrated in the drawings, a light-emitting diode lamp is a device in which at least one light-emitting diode 1 is mounted on the surface of a mounting substrate. More specifically, an n-electrode terminal and a p-electrode terminal are provided on the surface of the mounting substrate. Further, an n-type ohmic electrode that acts as a first electrode for the light-emitting diode and the n-electrode terminal of the mounting substrate are connected, for example, using a gold wire (wire bonding). On the other hand, a p-ohmic electrode that acts as a second electrode for the light-emitting diode and the p-electrode terminal of the mounting substrate are also connected, for example, using a gold wire. The surface of the mounting substrate on which the light-emitting diode is mounted may be sealed using an epoxy resin or the like.

<Illumination Device>

Although not illustrated in the drawings, an illumination device describes a device having at least a substrate on which wiring and/or through-holes and the like are formed, a plurality of light emitting diode lamps attached to the surface of the substrate, and a reflector or a shade which has a U-shaped cross-section, with the light emitting diode lamps provided inside the bottom of the U-shape.

[Method of Manufacturing Light-Emitting Diode]

Next is a description of a method of manufacturing the light-emitting diode according to an embodiment of the present embodiment.

<Support Substrate Production Step>

The semiconductor substrate used for supporting the structure containing the junction layer, the metal reflective film and the compound semiconductor layer is prepared by forming a layer or the like of a material suitable for joining to this structure, and then supporting the structure on this layer. In the present description, a substrate having this type of layer provided on a semiconductor substrate is termed the "support substrate".

[1] The Case where a Ge Substrate is Used as the Semiconductor Substrate

Figure 12:
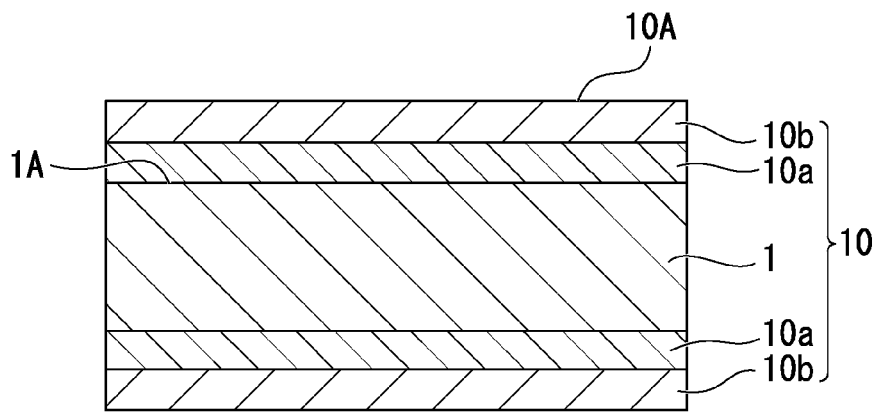
FIG. 12 is a schematic cross-sectional view for explaining a method of manufacturing a light-emitting diode according to an embodiment of the present invention.

As illustrated in FIG. 12, a layer composed of Au/Pt is formed by sequentially stacking a Pt layer 10a and an Au layer 10b on the upper surface 1A of a Ge substrate (semiconductor substrate) 1, and a layer composed of Pt/Au is similarly formed on the rear surface of the Ge substrate 1 by sequentially stacking a Pt layer 10a and an Au layer 10b, thus completing preparation of a support substrate 10 for supporting the structure containing the compound semiconductor layer 20.

The layers composed of Au/Pt are not limited to these particular materials, and other materials may be selected, provided they do not impair the effects of the present invention.

[2] The Case where an Si Substrate is Used as the Semiconductor Substrate

When an Si substrate (semiconductor substrate) is used, then in a similar manner to that described for the Ge substrate, a layer composed of Au/Pt or the like is formed on the upper surface of the Si substrate, and a layer composed of Pt/Au or the like is formed on the rear surface of the Si substrate, thus completing preparation of the support substrate 10.

The layers composed of Au/Pt are not limited to these particular materials, and other materials may be selected, provided they do not impair the effects of the present invention.

[3] The Case where a GaP Substrate is Used as the Semiconductor Substrate

When a GaP substrate (semiconductor substrate) is used, then in a similar manner to that described for the Ge substrate, a layer composed of Au/Pt or the like is formed on the upper surface of the GaP substrate, and a layer composed of Pt/Au or the like is formed on the rear surface of the GaP substrate, thus completing preparation of the support substrate 10.

The layers composed of Au/Pt are not limited to these particular materials, and other materials may be selected, provided they do not impair the effects of the present invention.

[4] The Case where a GaAs Substrate is Used as the Semiconductor Substrate

When a GaAs substrate (semiconductor substrate) is used, then in a similar manner to that described for the Ge substrate, a layer composed of Au/Pt or the like is formed on the upper surface of the GaAs substrate, and a layer composed of Pt/Au or the like is formed on the rear surface of the GaAs substrate, thus completing preparation of the support substrate 10.

The layers composed of Au/Pt are not limited to these particular materials, and other materials may be selected, provided they do not impair the effects of the present invention.

<Compound Semiconductor Layer Formation Step>

Figure 13:
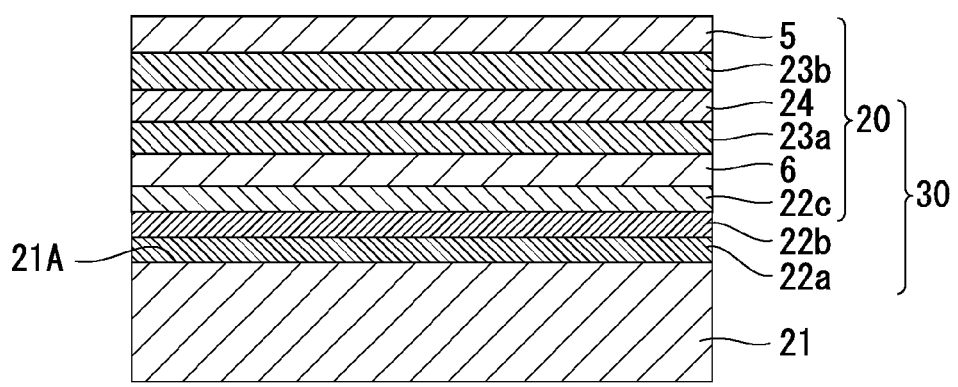
FIG. 13 is a schematic cross-sectional view for explaining a method of manufacturing a light-emitting diode according to an embodiment of the present invention.

First, as illustrated in FIG. 13, a plurality of epitaxial layers are grown on one surface 21A of a growth substrate 21, thus forming an epitaxial stacked structure 30 containing the compound semiconductor layer 20.

The semiconductor substrate 21 is a substrate for forming the epitaxial stacked structure 30, and is, for example, a Si-doped n-type monocrystalline GaAs substrate in which the surface 21A is inclined 15° from the (100) plane. When AlGaInP layers or AlGaAs layers are used for the epitaxial stacked structure 30, a monocrystalline gallium arsenide (GaAs) substrate can be used as the substrate for forming the epitaxial stacked structure 30.

Examples of methods that can be used for forming the compound semiconductor layer 20 include metal organic chemical vapor deposition (MOCVD) methods, molecular beam epitaxy (MBE) methods, and liquid phase epitaxy (LPE) methods.

In the present embodiment, each layer is grown epitaxially by a reduced-pressure MOCVD method using trimethylaluminum $((CH_3)_3Al)$, trimethylgallium $((CH_3)_3Ga)$ and trimethylindium $((CH_3)_3In)$ as the raw materials for the group III elements.

Further, bis(cyclopentadienyl)magnesium $((C_5H_5)_2Mg)$ is used as a Mg doping raw material. Furthermore, disilane $(Si_2H_6)$ is used as a Si doping raw material. Moreover, phosphine $(PH_3)$ and arsine $(AsH_3)$ are used as raw materials for the group V elements.

The lower current diffusion layer (GaP layer) 5 is grown, for example, at 750° C., whereas the other epitaxial growth layers are grown, for example, at 730° C.

Specifically, first, a buffer layer 22a is formed on the surface 21A of the semiconductor substrate 21. For example, a Si-doped n-type GaAs is used as the buffer layer 22a, with a carrier concentration of $2\times10^{18}$ cm$^{-3}$ and a thickness of 0.5 μm.

Next, in the present embodiment, an etching stop layer 22b is formed on the buffer layer 22a.

The etching stop layer 22b is a layer for preventing etching of the cladding layer and the light-emitting layer when the semiconductor substrate is removed by etching, and is, for example, formed from Si-doped $(Al_{0.5}Ga_{0.5})_{0.5}In_{0.5}P$, with a carrier concentration of $1\times10^{18}$ cm$^{-3}$ and a thickness of 0.5 μm.

Subsequently, the contact layer 22c is formed on the etching stop layer 22b. The contact layer 22c is, for example, formed from Si-doped n-type GaAs, with a carrier concentration of $2\times10^{18}$ cm$^{-3}$ and a thickness of 0.05 μm.

Next, the upper current diffusion layer 6 is formed on the contact layer 22c. The upper current diffusion layer 6 is, for example, formed from Si-doped $(Al_{0.5}Ga_{0.5})_{0.5}In_{0.5}P$, with a carrier concentration of $3\times10^{18}$ cm$^{-3}$ and a thickness of 5.0 μm.

The cladding layer 23a is then formed on the upper current diffusion layer 6. The cladding layer 23a is, for example, formed from Si-doped n-type $Al_{0.45}Ga_{0.55}As$, with a carrier concentration of $2\times10^{18}$ cm$^{-3}$ and a thickness of 0.5 μm.

Next, the light-emitting layer 24 is formed on the cladding layer 23a. The light-emitting layer 24 is, for example, formed from a stacked structure composed of five layers of undoped InGaAs as well layers and four layers of $(Al_{0.15}Ga_{0.85})As$ as barrier layers, with the thickness of each of these layers being 0.007 μm. A guide layer may be provided between the light-emitting layer 24 and the cladding layer 23a. The guide layer is, for example, formed from $(Al_{0.25}Ga_{0.75})As$ with a thickness of 0.05 μm.

Subsequently, the cladding layer 23b is formed on the light-emitting layer 24. The cladding layer 23b is, for example, formed from Mg-doped n-type $Al_{0.45}Ga_{0.55}As$, with a carrier concentration of $4\times10^{17}$ cm$^{-3}$ and a thickness of 0.5 μm. A guide layer may be provided between the light-emitting layer 24 and the cladding layer 23b. The guide layer is, for example, formed from $(Al_{0.25}Ga_{0.75})As$ with a thickness of 0.3 μm.

Next, the lower current diffusion layer 5 is formed on the cladding layer 23b. The lower current diffusion layer 5 is, for example, a stacked structure composed of a layer formed from Mg-doped $(Al_{0.5}Ga_{0.5})_{0.5}In_{0.5}P$ with a carrier concentration of $4\times10^{17}$ cm$^{-3}$ and a thickness of 0.05 μm, a layer formed from Mg-doped $Ga_{0.7}In_{0.3}P$ with a carrier concentration of $4\times10^{17}$ cm$^{-3}$ and a thickness of 0.02 μm, and a layer formed from Mg-doped GaP with a carrier concentration of $4\times10^{17}$ cm$^{-3}$ and a thickness of 3.5 μm.

A capping layer may be provided on the lower current diffusion layer 5. For example, a layer formed from undoped GaAs can be used as the capping layer. The capping layer is provided for the purpose of temporarily protecting the surface of the lower current diffusion layer 5, and is removed prior to formation of the ohmic contact electrodes.

<Ohmic Contact Electrodes Formation Step>

Figure 14:
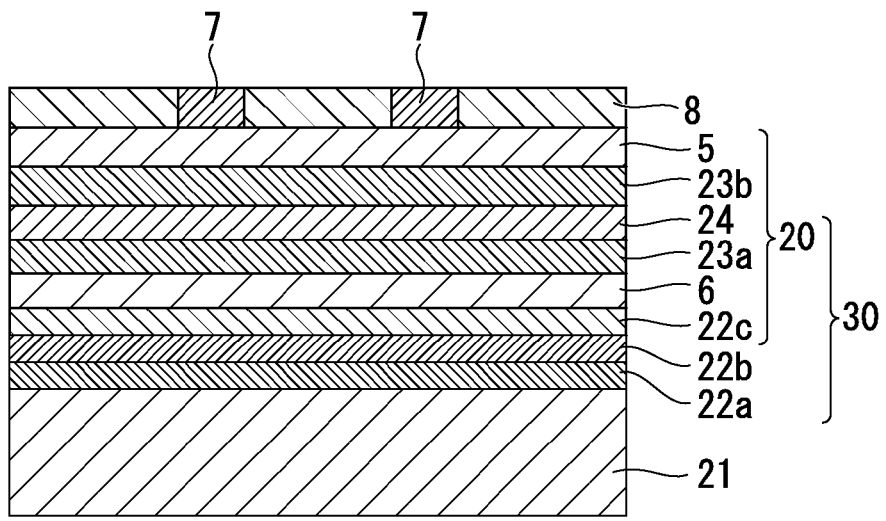
FIG. 14 is a schematic cross-sectional view for explaining a method of manufacturing a light-emitting diode according to an embodiment of the present invention.

Next, as illustrated in FIG. 14, the ohmic contact electrodes 7 are formed on the lower current diffusion layer 5.

First, the transparent dielectric film 8 is formed across the entire surface of the lower current diffusion layer 5. Formation of the transparent dielectric film 8 is achieved, for example, by using a CVD method to form an $SiO_2$ film 8.

Subsequently, photolithography techniques and etching techniques are used to form a plurality of through holes in the transparent dielectric film 8 for embedding the conductive members that constitute the ohmic contact electrodes 7. This plurality of through holes is formed in positions which, when viewed in plan view, do not overlap with the pad portion 12a of the surface electrode 12 that is formed in a subsequent step, and in positions which ensure that, when viewed in plan view, 5% or more and 40% or less of all of the ohmic contact electrodes 7 are disposed in positions that overlap with the linear portions.

More specifically, a photoresist pattern having holes that correspond with these through holes is formed on the $SiO_2$ film 8, and a hydrofluoric acid-based etchant is then used to remove the portions of the $SiO_2$ film 8 corresponding with the through holes, thereby forming the plurality of through holes in the $SiO_2$ film 8.

Next, a vapor deposition method or the like is used to form the AuBe alloy that functions as the material for the ohmic contact electrodes 7 in the plurality of through holes of the $SiO_2$ film 8.

<Metal Reflective Film Formation Step>

Figure 15:
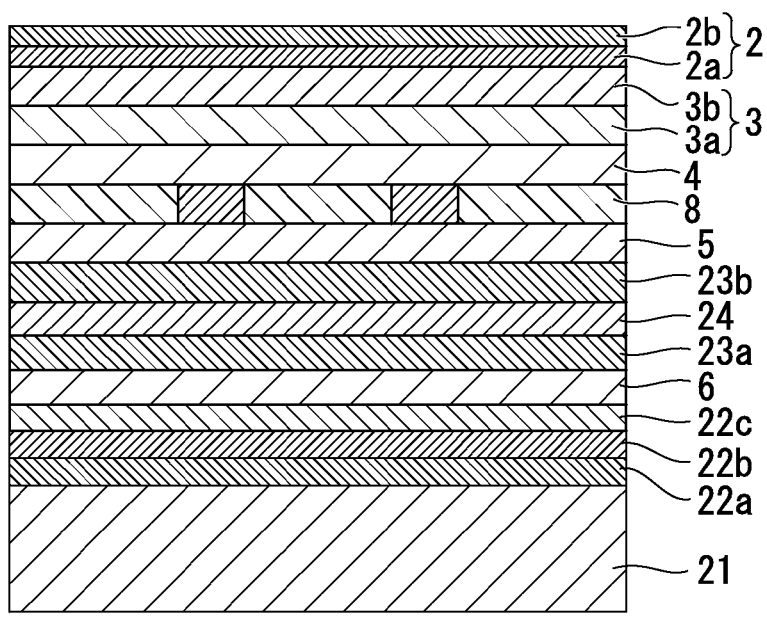
FIG. 15 is a schematic cross-sectional view for explaining a method of manufacturing a light-emitting diode according to an embodiment of the present invention.

Next, as illustrated in FIG. 15, the metal reflective film 4 is formed on the ohmic contact electrodes 7 and the $SiO_2$ film 8.

In a specific example, a vapor deposition method is used to form the metal reflective film 4 from Au on the ohmic contact electrodes 7 and the $SiO_2$ film 8.

<Diffusion Prevention Layer Formation Step>

Next, as illustrated in FIG. 15, the diffusion prevention layer 3 is formed on the metal reflective film 4. As illustrated in FIG. 14, the diffusion prevention layer 3 may be formed from a plurality of layers (3a and 3b).

In a specific example, a vapor deposition method is used to form the diffusion prevention layer 3 from a Pt layer 3a and a Ti layer 3b on the metal reflective film 4.

<Junction Layer Formation Step>

Next, as illustrated in FIG. 15, the junction layer 2 is formed on the diffusion prevention layer 3. As illustrated in FIG. 14, the junction layer 2 may be formed from a plurality of layers (2a and 2b).

In a specific example, a vapor deposition method is used to form the junction layer 2, composed of an AuGe layer 2a formed from an Au-based eutectic metal and an Au layer 2b, on the diffusion prevention layer 3.

<Support Substrate Joining Step>

Figure 16:
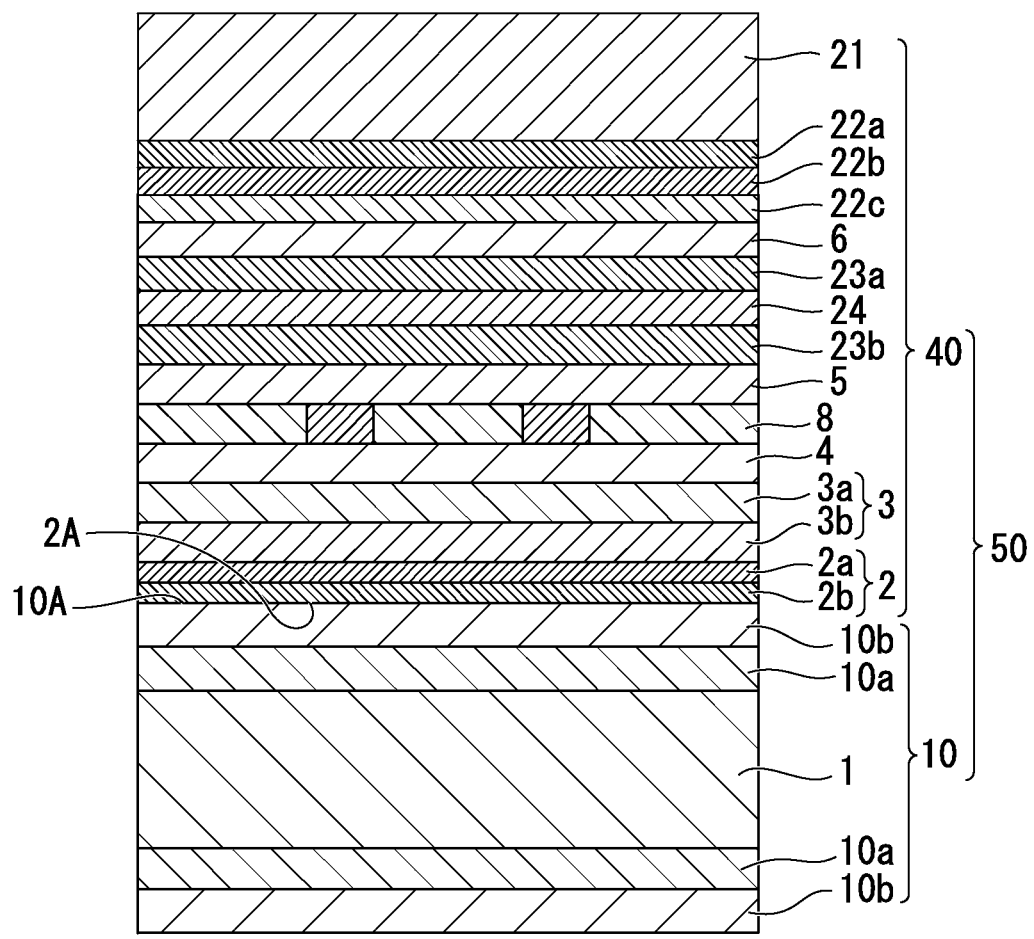
FIG. 16 is a schematic cross-sectional view for explaining a method of manufacturing a light-emitting diode according to an embodiment of the present invention.

Next, as illustrated in FIG. 16, a structure 40 which includes the epitaxial stacked structure 30 and the metal reflective film 4 and the like, and the support substrate 10 formed in the support substrate production step are transported into a reduced pressure apparatus and positioned so that a joining surface 2A of the junction layer 2 and a joining surface 10A of the support substrate 10 are superimposed facing each other.

Subsequently, the reduced pressure apparatus is evacuated down to a pressure of $3\times10^{-5}$ Pa, and with the superimposed structure and support substrate 10 heated at 400° C., a load of 500 kg is applied, thereby joining the joining surface 2A of the junction layer 2 and the joining surface 10A of the support substrate 10 to form a junction structure 50.

<Semiconductor Substrate and Buffer Layer Removal Step>

Figure 17:
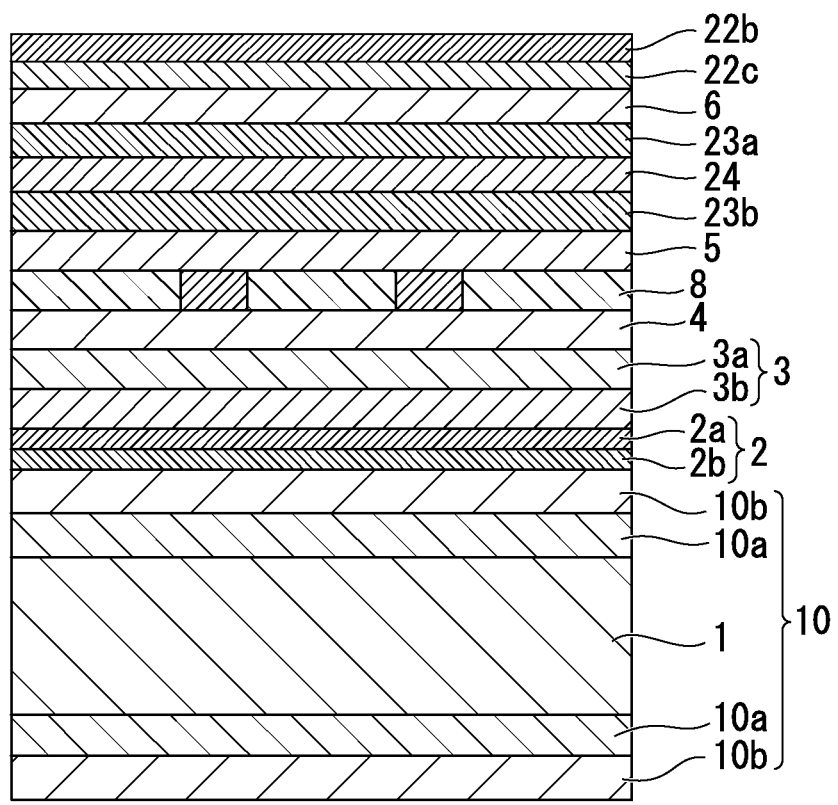
FIG. 17 is a schematic cross-sectional view for explaining a method of manufacturing a light-emitting diode according to an embodiment of the present invention.

Next, as illustrated in FIG. 17, the semiconductor substrate 21 and the buffer layer 22a are selectively removed from the junction structure 50 using an ammonia-based etchant.

<Etching Stop Layer Removal Step>

Figure 18:
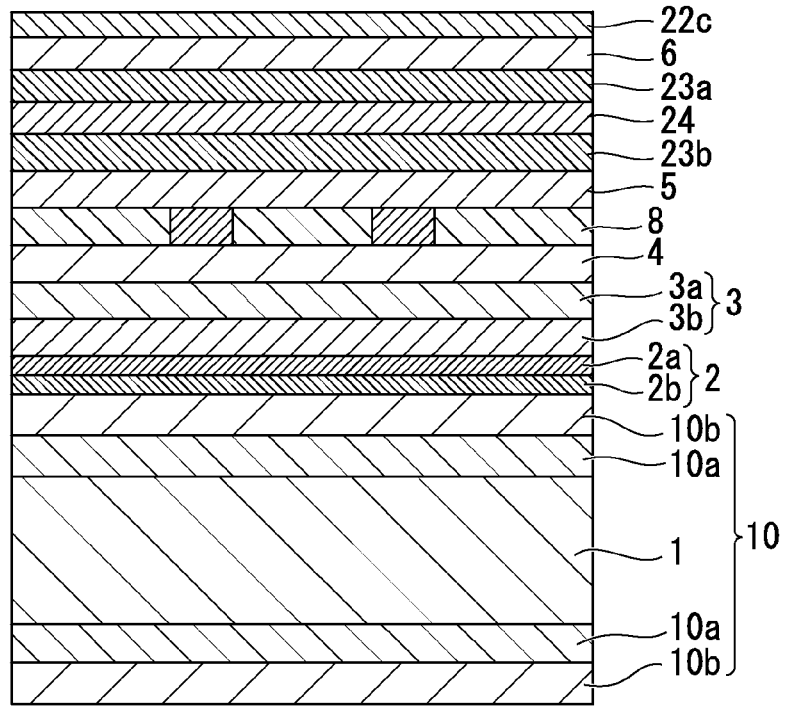
FIG. 18 is a schematic cross-sectional view for explaining a method of manufacturing a light-emitting diode according to an embodiment of the present invention.

Subsequently, as illustrated in FIG. 18, the etching stop layer 22b is selectively removed using a hydrochloric acid-based etchant. As a result, the compound semiconductor layer 20 containing the light-emitting layer 24 is formed.

<Ohmic Electrode Formation Step>

Figure 19:
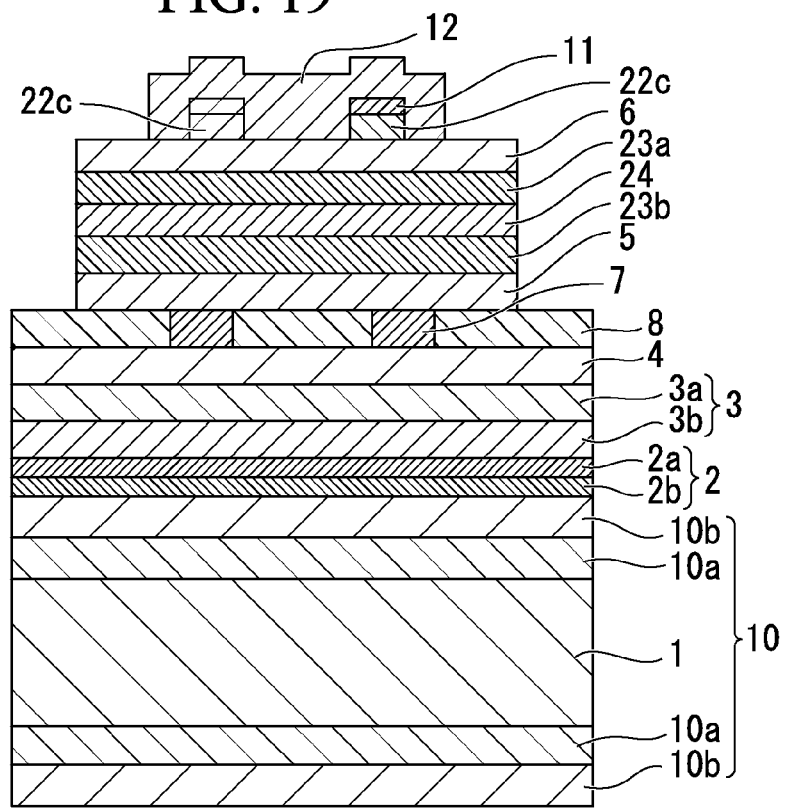
FIG. 19 is a schematic cross-sectional view for explaining a method of manufacturing a light-emitting diode according to an embodiment of the present invention.

Next, as illustrated in FIG. 19, the ohmic electrode 11 is formed on the compound semiconductor layer 20 on the opposite surface from the ohmic contact electrodes 7.

In a specific example, a vapor deposition method is used to deposit a film of an AuGeNi alloy with a thickness of 0.1 µm across the entire surface, and photolithography techniques and etching techniques are then used to pattern the AuGeNi alloy film, thus forming the ohmic electrode 11 composed of the four linear regions 11ba, 11bb, 11ca and 11cb illustrated in FIG. 2B.

Using the mask used in the patterning of the above ohmic electrode formation step, those portions of the contact layer 22c other than the portions directly beneath the ohmic electrode 11 are removed by etching using, for example, a mixed solution of ammonia water ($NH_4OH$), hydrogen peroxide ($H_2O_2$) and pure water ($H_2O$). As a result, the plan view shapes of the ohmic electrode 11 and the contact layer 22c adopt essentially the same shape, as illustrated in FIG. 1.

The linear regions of the ohmic electrode 11 are formed in positions which, when viewed in plan view, do not overlap with the pad portion 12a of the surface electrode 12 that is formed in a subsequent step, and in positions which are covered by the four second linear portions 12bba, 12bbb, 12bca and 12bc among the linear portions 12b of the surface electrode 12.

<Surface Electrode Formation Step>

Next, the surface electrode 12 composed of the pad portion 12a and the linear portions 12b connected to the pad portion is formed on the surface of the compound semiconductor layer 20 on the opposite side from the ohmic contact electrodes 7 so as to cover the ohmic electrode 11.

In a specific example, a vapor deposition method is used to sequentially deposit an Au layer of thickness 0.3 µm, a Ti layer of thickness 0.3 µm and an Au layer of thickness 1 µm across the entire surface, and photolithography techniques and etching techniques are then used to pattern the Au/Ti/Au film to form the surface electrode 12 composed of the pad portion 12a and the linear portions 12b, including the two first linear portions 12baa and 12bab connected to the pad portion and the four second linear portions 12bba, 12bbb, 12bca and 12bcb, as illustrated in FIG. 2A.

The second linear portions are formed in positions that cover the four linear regions that constitute the ohmic electrode 11.

<Individual Segmentation Step>

Next, the light-emitting diodes on the wafer are segmented into individual devices.

Following removal of the semiconductor layer from the regions that are to be cut, the structure including the semiconductor substrate formed via the steps described above is cut with a blade dicer, for example at intervals of 350 µm, to complete fabrication of the light-emitting diode 100.

INDUSTRIAL APPLICABILITY

The light-emitting diode of the present invention can provide a light-emitting diode for which a low forward voltage can be achieved while maintaining a favorable light emission output.

DESCRIPTION OF THE REFERENCE SYMBOLS

1: Semiconductor substrate
2: Junction layer
4: Metal reflective film
7: Ohmic contact electrode
8: Transparent dielectric film
9: Reflective structure
10: Support substrate
11: Ohmic electrode
12: Surface electrode
12a: Pad portion
12b: Linear portion
20: Compound semiconductor layer
21: Growth substrate
100: Light-emitting diode

What is claimed is:

1. A light-emitting diode comprising:
a junction layer, a reflective structure containing a metal reflective film, and a compound semiconductor layer, which contains a first cladding layer, a second cladding layer, and a light-emitting layer sandwiched between the first cladding layer and the second cladding layer, provided in that order on an upper surface of a semiconductor substrate,
wherein a plurality of dot-shaped ohmic contact electrodes are provided between the metal reflective film and the compound semiconductor layer, an ohmic electrode and a surface electrode composed of a pad portion and a plurality of linear portions connected to the pad portion are provided in that order on an opposite side of the compound semiconductor layer from the semiconductor substrate, a surface of the ohmic electrode is covered with the linear portions, the ohmic contact electrodes and the ohmic electrode are formed in positions that do not overlap with the pad portion in plan view, and 5% or more and 40% or less of the ohmic contact electrodes over the entire upper surface of the semiconductor substrate are disposed in positions that overlap with the linear portions in plan view.

2. The light-emitting diode according to claim 1, wherein the pad portion is circular when viewed in plan view.

3. The light-emitting diode according to claim 1, wherein the linear portions are composed of two first linear portions, which extend in a linear direction from peripheral edges on either side of a diameter of the pad portion, along a line that passes through a center of the pad portion, and a plurality of second linear portions which each extends in a direction orthogonal to the first linear portions.

4. The light-emitting diode according to claim 1, wherein the linear portions are composed of two second linear portions which extend along lines that are tangent to peripheral edges of a circular pad portion.

5. The light-emitting diode according to claim 1, wherein the reflective structure is composed of a transparent dielectric film and a metal film.

6. The light-emitting diode according to claim 5, wherein a thickness of the transparent dielectric film is ¾ or ⅝ of a wavelength emitted by the light-emitting diode in the transparent dielectric film.

7. The light-emitting diode according to claim 5, wherein the transparent dielectric film is composed of $SiO_2$.

8. The light-emitting diode according to claim 1, wherein the pad portion is composed of a plurality of circular pads.

9. The light-emitting diode according to claim 1, wherein the semiconductor substrate is composed of any of Ge, Si, GaP and GaAs.

10. The light-emitting diode according to claim 1, wherein the junction layer comprises a combination of any of an Au layer, an AuGe layer, an AuSn layer, an AuSi layer and an AuIn layer.

11. The light-emitting diode according to claim 1, wherein the light-emitting layer is composed of any of AlGaAs, InGaAs, GaInP, and AlGaInP.

12. A light-emitting diode lamp, comprising the light-emitting diode acccording to claim 1.

13. An illumination device, equipped with a plurality of the light-emitting diodes according to claim 1.

14. The light-emitting diode according to claim 3, wherein the plurality of the ohmic contact electrodes are composed of a first row and a second row aligned in parallel to the first linear portions, a third row and a fourth row aligned in parallel to the second linear portions, each of the plurality of ohmic contact electrodes within a given first, second, third, or fourth row are spaced apart from each adjacent ohmic contact electrode by a periodic distance, each of the ohmic contact electrodes of the second row is offset by one-half the periodic distance from the first row along the direction parallel to the first linear portions, and each of the ohmic contact electrodes of the third row is offset by one-half the periodic distance from the fourth row along the direction parallel to the second linear portions.

* * * * *